(12) United States Patent
Tamura

(10) Patent No.: US 7,050,032 B2
(45) Date of Patent: May 23, 2006

(54) RAM-INCORPORATED DRIVER, AND DISPLAY UNIT AND ELECTRONIC EQUIPMENT USING THE SAME

(75) Inventor: Tsuyoshi Tamura, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 374 days.

(21) Appl. No.: 09/911,829

(22) Filed: Jul. 25, 2001

(65) Prior Publication Data

US 2002/0011998 A1    Jan. 31, 2002

Related U.S. Application Data

(63) Continuation of application No. PCT/JP00/08384, filed on Nov. 29, 2000.

(30) Foreign Application Priority Data

Nov. 29, 1999 (JP) .............................. 11-338146
Jul. 12, 2000 (JP) ............................. 2000-211079

(51) Int. Cl.
G09G 3/36 (2006.01)

(52) U.S. Cl. ........................................ 345/98

(58) Field of Classification Search .................. 345/98, 345/100, 589, 204, 87; 348/14.14, 14.15, 348/14.13, 14.01
See application file for complete search history.

(56) References Cited

U.S. PATENT DOCUMENTS

| | | | |
|---|---|---|---|
| 5,412,777 A | | 5/1995 | Wakimoto .................... 345/570 |
| 5,493,329 A | * | 2/1996 | Ohguchi .................. 348/14.13 |
| 5,726,677 A | | 3/1998 | Imamura ..................... 345/99 |
| 5,990,860 A | | 11/1999 | Takeuchi .................... 345/667 |
| 6,137,466 A | * | 10/2000 | Moughanni et al. .......... 345/99 |
| 6,147,672 A | * | 11/2000 | Shimamoto ................. 345/589 |
| 6,313,863 B1 | * | 11/2001 | Chida ..................... 348/14.01 |
| 6,329,973 B1 | * | 12/2001 | Akimoto et al. ............. 345/98 |
| 6,335,728 B1 | * | 1/2002 | Kida et al. ................. 345/204 |
| 6,340,959 B1 | * | 1/2002 | Inamori ..................... 345/3.1 |

(Continued)

FOREIGN PATENT DOCUMENTS

EP      0 655 725 A1    5/1995

(Continued)

OTHER PUBLICATIONS

Vesa Plug and Display (P&D™) Standard, Version 1, Jun. 11, 1997.

(Continued)

Primary Examiner—Xiao Wu
Assistant Examiner—Kevin M. Nguyen
(74) Attorney, Agent, or Firm—Oliff & Berridge, PLC

(57) ABSTRACT

The present invention provides a RAM-incorporated driver that enables the writing of moving-image data to a RAM simultaneously with the writing of still-image data to a RAM, at a reduced energy consumption. The RAM incorporated X-driver IC receives still-image data from an MPU and moving-image data that is input by a separate system through a high-speed serial transfer line in accordance with the LVDS standard. An LVDS reception circuit suppresses the consumption of a steady current by which the differential input receiver operates, based on a data validation signal that becomes active when transfer data on the high-speed serial data transfer line from the MPU becomes valid. The still-image data and moving-image data that is received by separate systems is written to a RAM through first and second bus lines, respectively. Reading of still-image data and moving-image data, which is stored in a RAM, as display data is controlled by a display address control circuit.

34 Claims, 19 Drawing Sheets

U.S. PATENT DOCUMENTS

| | | | |
|---|---|---|---|
| 6,370,603 B1 * | 4/2002 | Silverman et al. | 710/72 |
| 2002/0018058 A1 * | 2/2002 | Tamura | 345/204 |

FOREIGN PATENT DOCUMENTS

| | | |
|---|---|---|
| EP | 0 852 371 A1 | 7/1998 |
| JP | 61-99189 | 5/1986 |
| JP | 04219791 A | 8/1992 |
| JP | 05257463 A | 10/1993 |
| JP | A-6-130910 | 5/1994 |
| JP | A-7-92953 | 4/1995 |
| JP | 9-34426 | 2/1997 |
| JP | A-34426 | 2/1997 |
| JP | 09281933 A * | 10/1997 |
| JP | A-9-281933 | 10/1997 |
| JP | 11242463 A | 9/1999 |
| WO | WO 97/11447 | 3/1997 |
| WO | WO 00/60570 | 10/2000 |

OTHER PUBLICATIONS

U.S. Appl. No. 09/911,409, filed Jul. 25, 2001, Tsuyoshi Tamura.

* cited by examiner

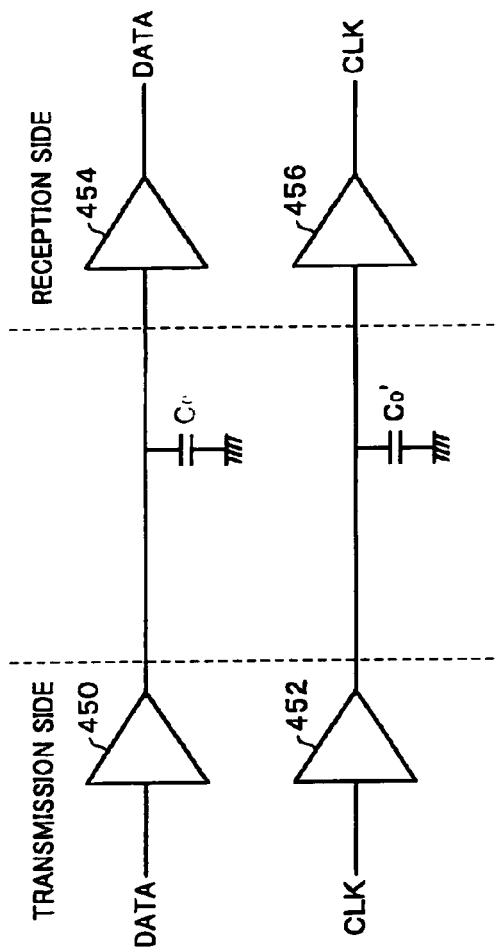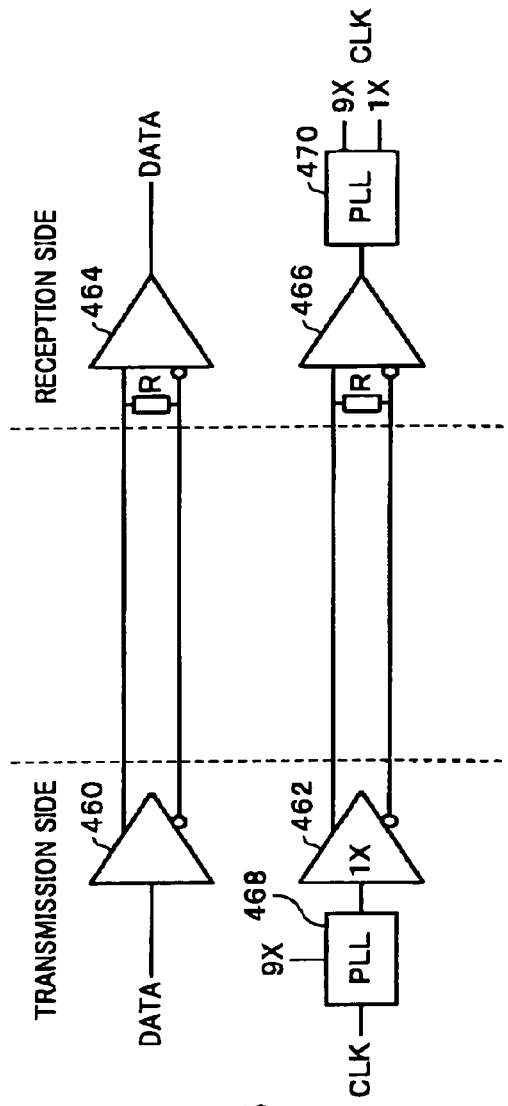
FIG. 11A
FIG. 11B

US 7,050,032 B2

RAM-INCORPORATED DRIVER, AND DISPLAY UNIT AND ELECTRONIC EQUIPMENT USING THE SAME

BACKGROUND OF THE INVENTION

Japanese Patent Application No. 11-338146, filed Nov. 29. 1999, is hereby incorporated by reference in its entirety. Japanese Patent Application No. 2000-211079, filed Jul. 12, 2000, is hereby incorporated by reference in its entirety. International Application No. PCT/JP00/08384, filed Nov. 29, 2000 is hereby incorporated by reference in its entirety.

1. Field of Invention

The present invention relates to a RAM-incorporated driver that drives the display of still and moving images on one screen, together with a display unit and electronic equipment that uses the same.

2. Description of Related Art

Recent advances in communications and packaging technology have made it possible to display various types of highly informative data on a display section of a portable electronic equipment. The data can include not only character text consisting of numerals and characters, but also more complex data, such as still and moving images.

There have been various proposals for the format that should be used in displaying data by such electronic equipment. For example, in the case of a mobile telephone, a technique has been proposed for receiving or transmitting image data that has been compressed and encoded in accordance with the Moving Picture Experts Group (MPEG) standard. As shown, for example in FIG. 3, in such a case, received moving images are displayed on a moving-image display area 22A of a liquid crystal panel 22. Still images giving explanatory or operating information relating to those moving images are displayed on a still-image display area 22B of the liquid crystal panel 22, by way of example.

To display a moving image in the moving-image display area 22A, it is necessary to rewrite moving-image data in a moving-image storage area corresponding to the moving-image display area 22A, which is part of the storage area of a RAM within the liquid crystal driver. Of course, the moving-image data must be rewritten periodically and also substantially in real-time.

The still images displayed in the still-image display area 22B change in accordance with factors such as the operation of the keys of the mobile telephone, making it necessary to rewrite still-image data in a still-image storage area corresponding to the still-image display area 22B, within the storage area in a RAM. However, the rewriting of still-image data in the still-image storage area of the RAM periodically uses the bus line over which the moving-image data is being transferred, so it is only possible to use the gap between the transfer of one screen of moving-image data and the transfer of the next screen of moving-image data therefor.

In this manner, the transfer of still-image data within the limited times between screens of moving-image data can restrict the operating time in which the MPU can supply moving-image data and still-image data to the display unit, which increases the time-related restrictions on the operation of the microprocessor unit (MPU) for controlling circuits other than those of the display unit.

It is expected that future enlargements of the display area and increases in the number of gray scales will lead to moving images displayed on the display section that are even more complex, and which are easy to see and useful from the user's point of view. As the amount and complexity of the moving-image continues to increase, even more severe restrictions will be placed on the MPU's operating time. For that reason, it is preferable to enable transfer that moves moving-image data as rapidly as possible. On the other hand, it is also essential that a portable type of information terminal, such as a mobile telephone, which is convenient for displaying such informative information should have reduced energy consumption.

SUMMARY OF THE INVENTION

The present invention was designed in the light of the above-described technical problems and provides a RAM-incorporated driver that enables the rewriting of still-image data, irrespective of the timing at which moving image data is being rewritten into a RAM, together with a display unit and electronic equipment using the same.

Another objective of the present invention is to provide a RAM-incorporated driver that enables the rewriting of large amounts of moving-image data and still-image data independently, at reduced energy consumption, together with a display unit and electronic equipment using the same.

In order to solve the above described technical problems, the present invention is directed to a RAM-incorporated driver which drives a display section based on still-image data and moving-image data, the RAM-incorporated driver includes a first port through which the still-image data or a given command is input, a second port through which the moving-image data, which is transferred serially over a serial transfer line, is input as a differential signal, a reception circuit which differentially amplifies the differential signal input from the second port and creating the moving-image data in a parallel state, a RAM which stores the still-image data that was input through the first port and the moving-image data that was created by the reception circuit, a first control circuit which controls writing or reading of the still-image data or the moving-image data that has been input separately through the first port or the second port, with respect to the RAM, and a second control circuit independently of the first control circuit, which controls the reading as display data of the still-image data or moving-image data that has been stored in the RAM, and driving the display section to display.

The present invention ensures that still images and moving images are input by separate systems through the first and second ports. Control over the writing of still-image data or moving-image data to a RAM and control over the reading of display data for driving the display section to display are also independent of each other. It is therefore possible to rewrite still-image data in a RAM while simultaneously rewriting moving-image data. Accordingly, it now becomes unnecessary to wait until the end of the writing of moving-image data before still-image data can be written. Moreover, it is possible to drive the display by display data, irrespective of this control over the writing of still-image data and moving-image data. High-speed signal transfer is possible because moving-image data that has been converted into serial data is input as a differential signal through the serial transfer line from the second port. In particular, detailed moving images can be displayed because it is possible to write amounts of moving-image data that have been increased by an enlargement of the display area or an increase in the number of gray scales, irrespective of the timing at which still-image data is written.

The present invention may comprise a halt control circuit which receives with the differential signal a data validation signal indicating whether or not the differential signal is valid, and halting at least part of an operation of the reception circuit, based on the data validation signal.

Since the data validation signal indicating whether or not the differential signal that is serial moving-image data is valid is received together with the differential signal and the current consumption accompanying the transmission and reception in serial transfer can be kept to a minimum by halting at least part of the operation of the reception circuit, it is possible to transfer large quantities of moving-image data efficiently without any deterioration in signal transfer performance.

With the present invention, the validation signal may be used as a synchronization signal synchronizing the writing of the moving-image data into the RAM.

With the present invention, the validation signal may be used as a synchronization signal that synchronizes the writing of the moving-image data for one line of the display section into the RAM.

With the present invention, the validation signal may be used as a synchronization signal that synchronizes the writing of the moving-image data for one full-screen of the display section into the RAM.

Such a configuration makes it possible to display moving-image data without errors, without having to transfer a vertical synchronization signal or horizontal synchronization signal.

With the present invention, the serial transfer line may be a transfer line in accordance with either of an LVDS standard, a USB standard or an IEEE 1394 standard. By transferring moving-image data over a high-speed serial transfer line conforming to one of those standards, it becomes possible to easily design an interface for the RAM-incorporated driver which enables the rewriting of large quantities of moving-image data and still-image data independently.

A display unit in accordance with the present invention can include a panel having an electro-optical element driven by a plurality of first electrodes and a plurality of second electrodes, the above-described RAM-incorporated driver which drives the plurality of first electrodes, and a scanning driver for scanning and driving the plurality of second electrodes.

This display unit makes it possible to implement a mixed display of still images and moving images, while reducing the load on the external MPU.

Electronic equipment in accordance with the present invention can include the display unit, and an MPU which supplies the command, the still-image data, and the moving-image data to the display unit.

Since this electronic equipment and this display unit reduce the load on the MPU during the display of a mixture of still images and moving images, it is thereby possible to increase the operating efficiency of the MPU.

BRIEF DESCRIPTION OF THE DRAWINGS

The invention is described in detail with reference to the following figures, wherein like numerals reference like elements, and wherein:

FIGS. 11A and 11B are illustrative diagrams showing the interface section of an LVDS-standard high-speed serial transfer line in comparison with the interface section of a prior-art display data transfer line;

DETAILED DESCRIPTION OF PREFERRED EMBODIMENTS

Figure 1:
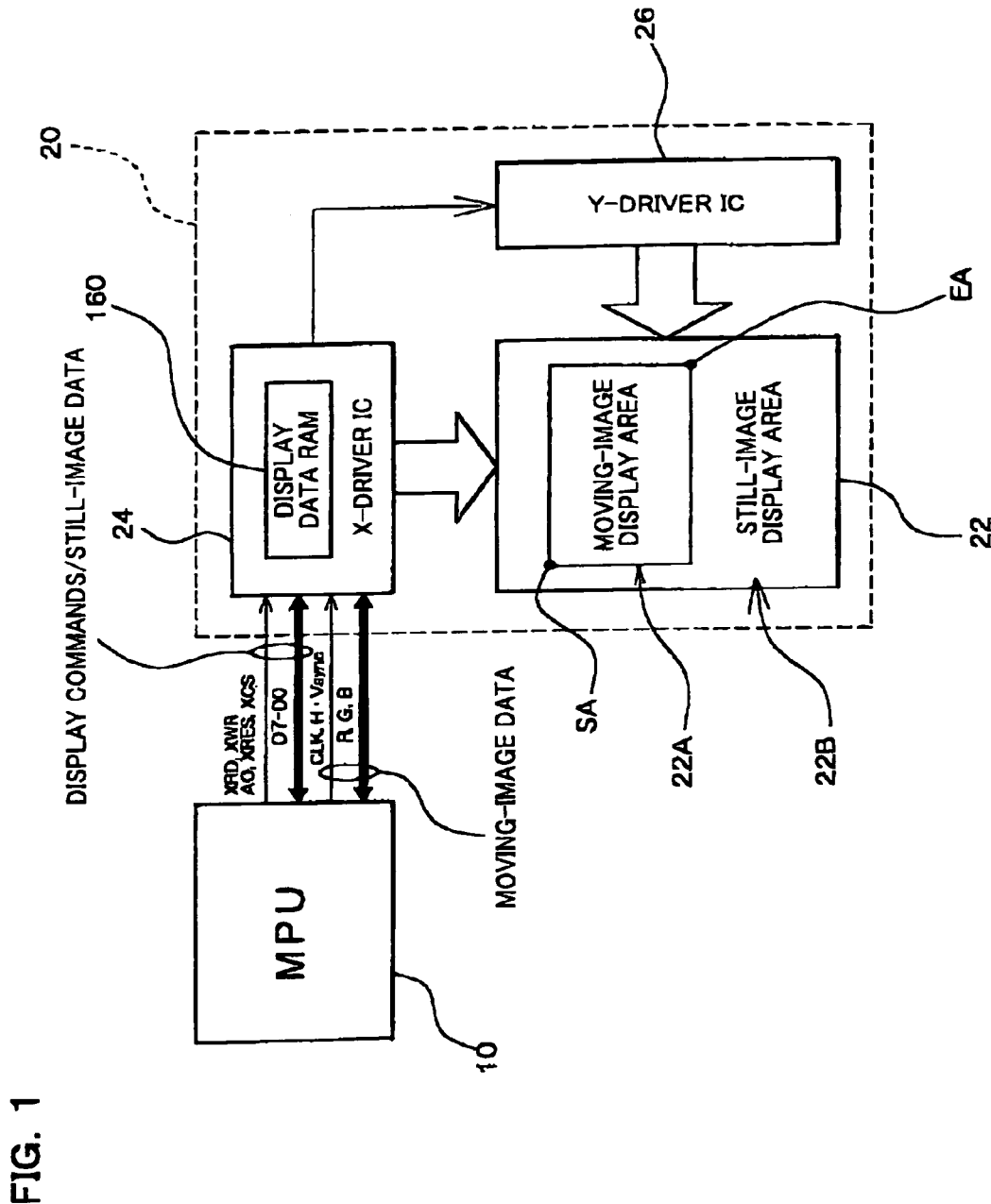
FIG. 1 is a schematic block diagram of electronic equipment to which the present invention is applied.

A first embodiment of the present invention is described below with reference to FIGS. 1 to 7. FIG. 1 is a schematic block diagram of electronic equipment to which the present invention is applied. In FIG. 1, this electronic equipment is configured of a microprocessor unit (MPU) 10 and a display unit 20. The display unit 20 has a matrix panel having electro-optical elements, such as a color liquid crystal panel 22, a RAM-incorporated X-driver IC 24 for driving this liquid crystal panel 22, and a Y-driver IC 26 for scanning.

The matrix panel 22 could be one that uses a liquid crystal having optical characteristics that change on the application of a voltage, and other electro-optical elements. For example, the liquid crystal panel 22 could be configured of a simple matrix panel in which a liquid crystal is sealed between a first substrate on which is formed a plurality of segment electrodes (first electrodes) and a second substrate on which is formed a common electrode (second electrode). The liquid crystal panel 22 could also be configured of an active matrix panel using three-terminal elements or two-terminal elements such as thin-film transistors (TFTs) or thin-film diodes (TFDs). Such an active matrix panel would also have a plurality of signal electrodes (first electrodes) driven by the RAM-incorporated X-driver IC 24 and a plurality of scan electrodes (second electrodes) driven to scan by the Y-driver IC 26.

It is possible to display still images and moving images simultaneously on the liquid crystal panel 22. In such a case, areas for a moving-image display area 22A, determined by the image size of moving-image data stored in the MPU 10, and a still-image display area (text data display area) 22B, outside thereof, are set in the liquid crystal panel 22.

As shown in FIG. 1, two main types of data are supplied from the MPU 10 to the display unit 20, display command/still-image data and moving-image data. Representative examples of display commands include a signal A0 that indicates the difference between commands and data, an inverted reset signal XRES, an inverted chip select signal XCS, an inverted read signal XRD, and an inverted write signal XWR. Data signals D7 to D0 are 8-bit command data (including address data for still images and moving images) or still-image data signals, as distinguished by the logic of the command/data identification signal A0. The moving-image data is 6-bit R, G, and B signals, and a clock signal CLK and horizontal/vertical synchronization signal H.Vsync are also supplied.

Thus a bus for display command/still-image data and a bus for moving-image data are separated in this embodiment of the present invention.

Figure 2:
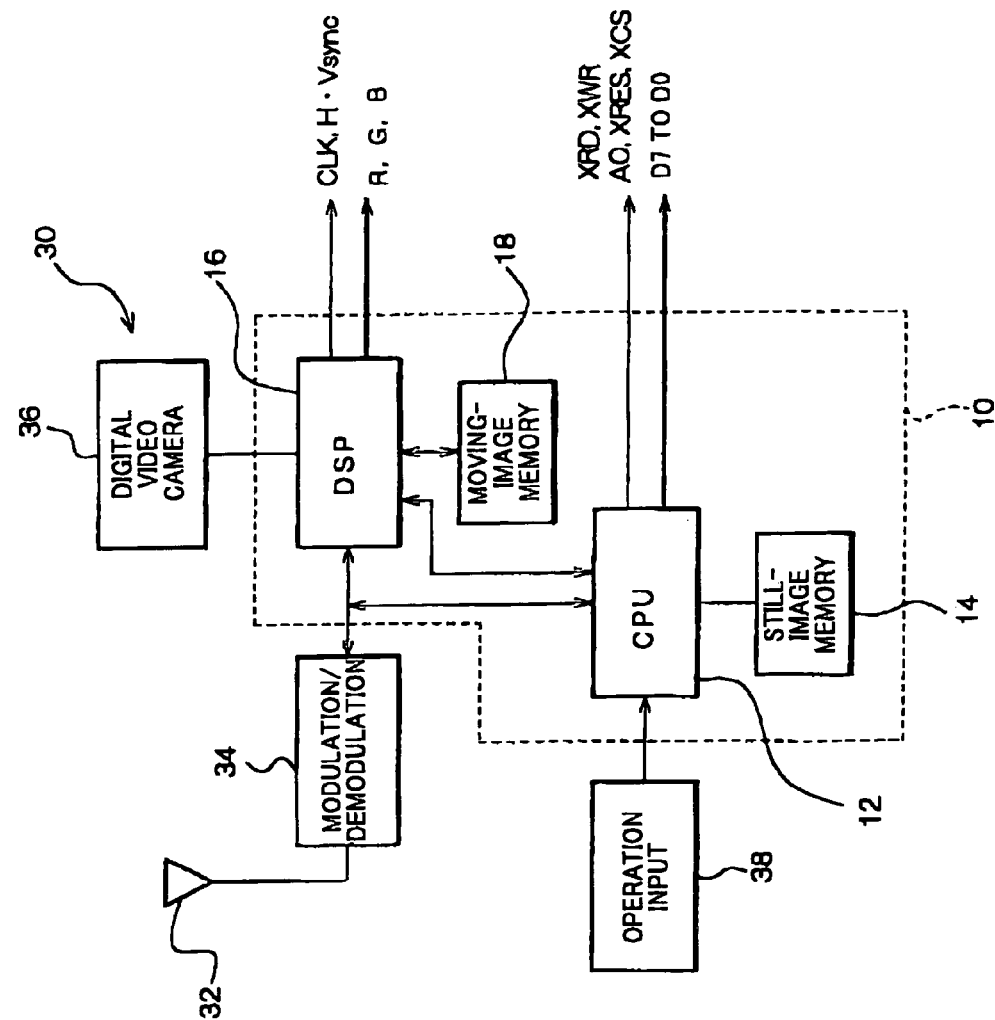
FIG. 2 is a schematic block diagram of a mobile telephone that is an example of the electronic equipment of FIG. 1.

An example shown in FIG. 2 is of the MPU 10 and display unit 20 of FIG. 1 installed into a mobile telephone 30. The MPU 10 shown in FIG. 2 has a CPU 12 for controlling the mobile telephone 30, and a still-image memory 14 and a digital signal processor (DSP) 16 are connected to this CPU 12. A moving-image memory 18 is also connected to the DSP 16.

A modulation/demodulation circuit 34 is also provided in the mobile telephone 30, for demodulating signals received through an antenna 32 and modulating signals to be transmitted by the antenna 32. It is also possible to use the antenna 32 to transmit and receive moving-image data that has been encoded in accordance with the layer-IV standard of the Moving Picture Experts Group (MPEG).

A digital video camera 36 can also be provided in this mobile telephone 30. Moving-image data can be fetched through this digital video camera 36. The information necessary for operations such as transmission and reception by the mobile telephone 30 or image capture by the digital video camera 36 is input through an operation input section 38.

Figure 3:
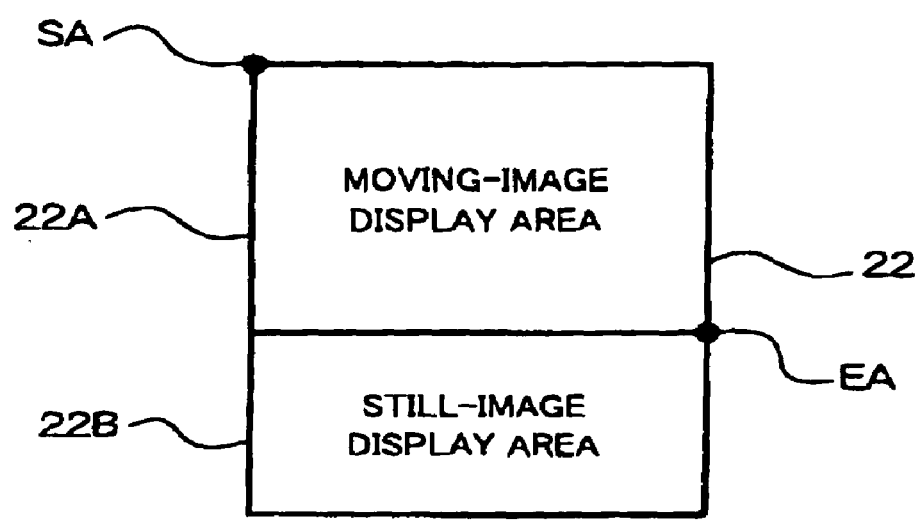
FIG. 3 is a schematic illustrative diagram of an example of display that differs from the display example of the liquid crystal panel shown in FIG. 1.

When a moving image is displayed in the moving-image display area 22A of the liquid crystal panel 22, the CPU 12 provided in the MPU 10 determines the dimensions of that moving image from moving-image information. In other words, it determines a start address SA and an end address EA of the moving image shown in FIG. 1. It is to be understood that the moving-image display area 22A and the still-image display area 22B could be divided vertically by a line, as shown in FIG. 3. In this case, the start address SA and the end address EA are determined from the size of the moving image in a similar manner.

The moving image displayed in the moving-image display area 22A is supplied from the antenna 32 or the digital video camera 36 in this embodiment of the invention. Signals input from the antenna 32 are demodulated through the modulation/demodulation circuit 34 and are processed by the DSP 16. The DSP 16 is connected to the moving-image processing memory 18, and expands compressed data that is input through the antenna 32 and the modulation/demodulation circuit 34 and also decodes data that has been encoded in accordance with the MPEG layer IV standard. Data that is to be transmitted through the modulation/demodulation circuit 34 and the antenna 32 is compressed by the DSP 16, and also encoded if it is to be transmitted in a format in accordance with the MPEG layer IV standard. In this manner, the DSP 16 can also have the function of a decoder and encoder for MPEG layer IV data, by way of example.

Signals from the digital video camera 36 are input to the DSP 16, and signals that have been input by the antenna 32 or the digital video camera 36 are processed by the DSP 16 into RGB signals and are supplied to the display unit 20.

The CPU 12 outputs to the display unit 20 the commands and data necessary for displaying a still image on the liquid crystal panel 22, based on information from the operation input section 38 and using the still-image memory 14 if necessary.

It is therefore possible to implement ticket reservations based on information from the operation input section 38, wherein moving images are movie information that is distributed over the Internet and information for reserving theater tickets is displayed as still images. For that purpose, the CPU 12 also controls the sending out of still-image information (such as reservation information) through the modulation/demodulation circuit 34 and the antenna 32. The CPU 12 can also control the sending out of moving-image information captured by the digital video camera 36 over the modulation/demodulation circuit 34 and the antenna 32, if necessary.

Figure 4:
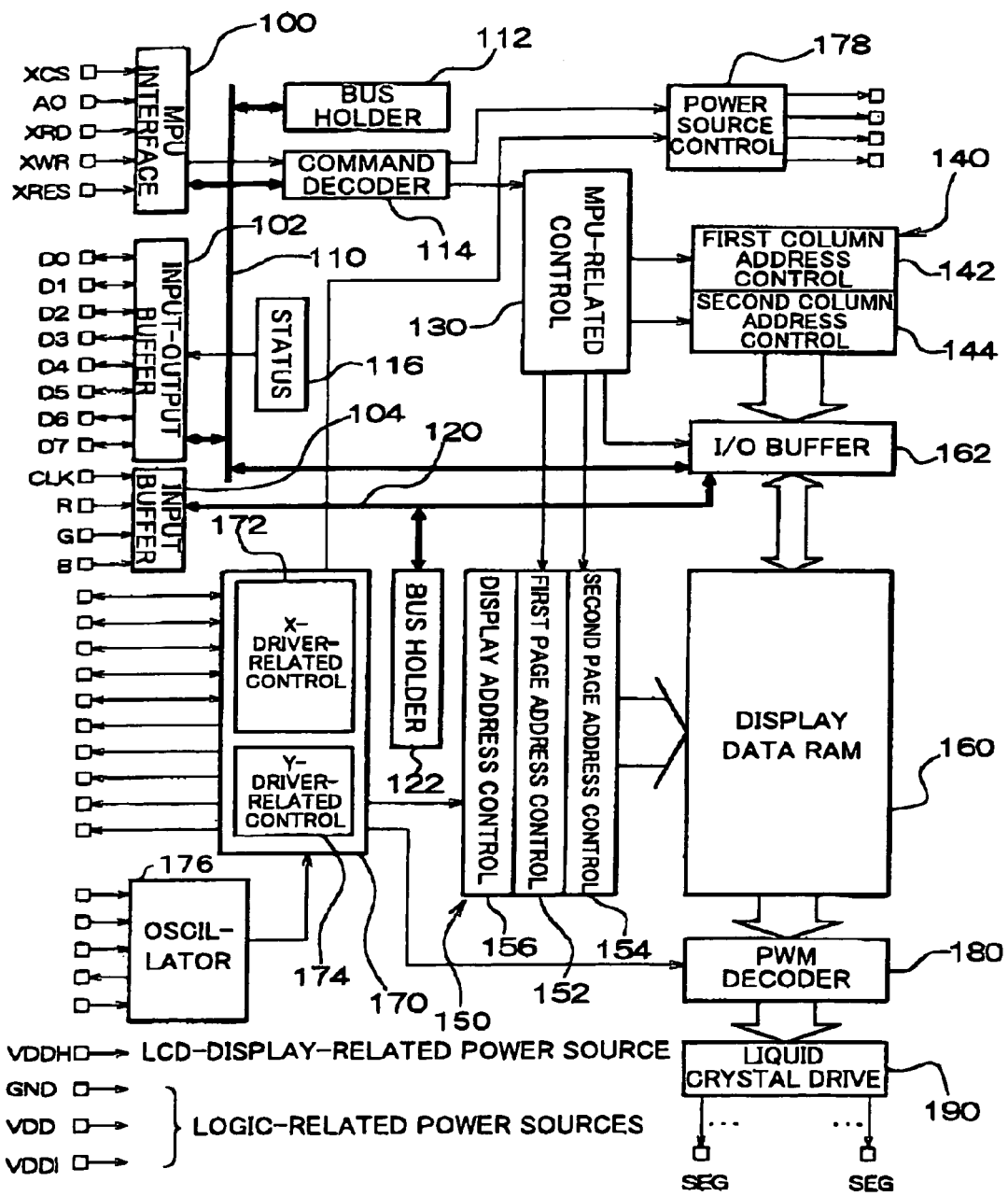
FIG. 4 is a schematic block diagram of the X-driver IC of FIG. 1.

FIG. 4 shows an exemplary block diagram of the RAM-incorporated X-driver IC 24. An MPU interface 100, an input-output buffer 102, and an input buffer 104 are provided as input-output circuitry for the RAM-incorporated X-driver IC 24 of FIG. 4.

Signals such as the inverted chip select signal XCS, the command/data identification signal A0, the inverted read signal XRD, the inverted write signal XWR, and the inverted reset signal XRES are input to the MPU interface 100.

Data such as 8-bit command or still-image data D7 to D0 is input to the input-output buffer 102. It should be understood that while FIG. 4 shows an example in which the signals D7 to D0 are input and output in parallel, it is also possible to use a serial input-output configuration in which the first bit is the identification signal A0, followed by the signals D7 to D0, if it is not necessary to read data to the MPU 10 from a display data RAM 160 within the X-driver IC 24. Accordingly, this makes it possible to reduce the number of terminals of the MPU 10 and the X-driver IC 24.

Data, such as moving-image data formed of 6-bit R, G, and B signals and the clock signal CLK, is input to the input buffer 104, by way of example. The clock signal 6-bit R, G, and B signals are input and output in parallel, in synchronization with the clock signal CLK.

The interior of the X-driver IC 24 is provided with a first bus line 110 connected to the MPU interface 100 and the input-output buffer 102 and a second bus line 120 connected to the input buffer 104.

A bus holder 112 and a command decoder 114 are connected to the first bus line 110 and another bus holder 122 is connected to the second bus line 120. Note that a status setting circuit 116 is connected to the input-output buffer 102 in such a manner that the operating state of the X-driver IC 24 is output to the MPU 10. This operating state is an internal state Set by the X-driver IC 24, such as whether or not the display is in an on state and a given scroll area within the screen has been set to scroll mode, with the configuration being such that a given command that has been input from the MPU 10 is decoded by the command decoder 114 which outputs the result thereof.

An I/O buffer 162 of the display data RAM 160 is connected to both the first and second bus lines 110 and 120, for the transfer of still-image data and moving-image data that is read from and written to the display data RAM 160.

In addition to the above described display data RAM 160 and I/O buffer 162, circuits such as an MPU-related control circuit 130, a column address control circuit 140, a page address control circuit 150, a driver-related control circuit 170, a PWM decoder circuit 180, and a liquid crystal drive circuit 190 are provided in the X-driver IC 24.

The MPU-related control circuit 130 controls reading and writing with respect to the display data RAM 160, based on commands from the MPU 10 that are input through the command decoder 114. The column address control circuit 140 and the page address control circuit 150 that are provided are controlled by this MPU-related control circuit 130. In this embodiment, the column address control circuit 140 can include a first column address control circuit 142, which specifies write column addresses for still-image data and read column addresses for still-image and moving-image data, and a second column address control circuit 144, which specifies write column addresses for moving-image data. The page address control circuit 150 has a first page address control circuit 152, which specifies write page addresses for still-image data and read page addresses for still-image and moving-image data, and a second page address control circuit 154, which specifies write page addresses for moving-image data. Note that the horizontal/vertical synchronization signal H.Vsync is input from the MPU 10 to the MPU-related control circuit 130, although this is not shown in FIG. 4. A horizontal synchronization signal Hsync is used for setting and resetting counters that are provided within the second column and page addresses control circuits 144 and 154, to suppress errors such as display distortion due to erroneous writing caused by noise or the like during the writing of moving-image data, as far as possible. The horizontal/vertical synchronization signal H.Vsync is also used for returning each of the column and page addressees to the respective start address SA. The page address control circuit 150 comprises a display address control circuit 156 which specifies display addresses for each line controlled by the driver-related control circuit 170.

The driver-related control circuit 170 comprises an X-driver-related control circuit 172 and a Y-driver-related control circuit 174. This driver-related control circuit 170 generates signals such as a gray scale control pulse GCP, a polarity inversion signal FR, and a latch pulse LP, to control the display address control circuit 156, the PWM decoder circuit 180, a power source control circuit 178, and the Y-driver IC 26, independently of the MPU-related control circuit 130.

The PWM decoder circuit 180 latches data that is read one line at a time from the display data RAM 160, and outputs a signal of a pulse width corresponding to gray scale value in accordance with the polarity inversion period. The liquid crystal drive circuit 190 shifts the voltage of a signal from the PWM decoder circuit 180 and supplies it to each segment electrode SEG of the liquid crystal panel 22 of FIG. 1.

Figure 5:
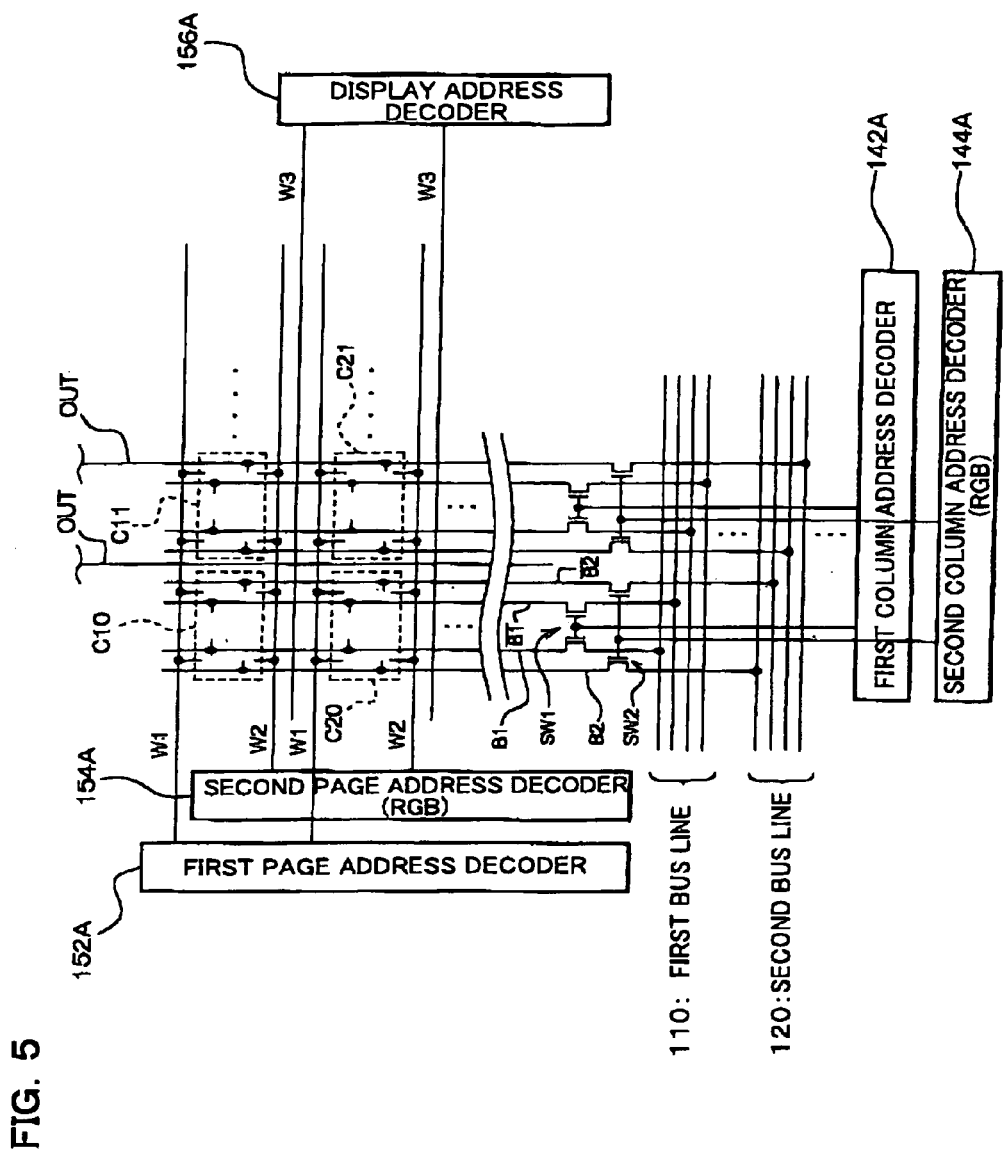
FIG. 5 is a schematic illustrative diagram of the display data RAM of FIG. 4, together with peripheral circuits.

FIG. 5 shows an exemplary schematic circuit diagram of the display data RAM 160 and its peripheral circuits. FIG. 5 shows first and second column address decoders 142A and 144A, first and second page address decoders 152A and 154A, and a display address decoder 156A that are provided in final stages of the first and second column address control circuits 142 and 144, the first and second page address control circuits 152 and 154, and the display address control circuit 156, respectively.

FIG. 5 also shows memory cells C10, C11, . . . , C20, C21, . . . of first and second rows. Each memory cell shown in FIG. 5 is connected to first to third word lines W1 to W3, a first bit line pair B1 and /B1, and a second bit line pair B2 and /B2.

The first column address decoder 142A outputs a signal that turns on and off a first column switch SW1 that is connected to the first bit line pair B1 and /B1. The second column address decoder 144A outputs a signal that turns on and off a second column switch SW2 that is connected to the second bit line pair B2 and /B2. The first page address decoder 152A supplies a signal that makes the first word line W1 active, the second page address decoder 154A supplies a signal that makes the second word line W2 active, and the display address decoder 156A supplies a signal that makes the third word line W3 active.

In comparison with the prior-art technique, this embodiment of the present invention is newly provided with the second word line W2, the second bit line pair B2 and /B2, the second column switch SW2, the second column address decoder 144A, and the second page address decoder 154A.

The second column and page addresses decoders 144A and 154A are used only when specifying column and page addressees for writing moving-image data (R, G, B), and this moving-image data (R, G, B) is written to memory cells through the second bus line 120 and the second column switch SW2 in accordance with this specification.

The first column and page addresses decoders 142A and 152A specify column and page addresses during the writing of still-image data and the reading of still-image and moving-image data. Data is read from or written to the display data RAM 160 through the first bus line 110 and the first column switch SW1 in accordance with this address specification.

The display address decoder 156A is designed to read data from all the memory cells on one line to a display data output line OUT, by making the third word line W3 active one line at a time in sequence. This read data is supplied to the PWM decoder circuit 180 of FIG. 4 and is supplied to the liquid crystal drive.

Figure 6:
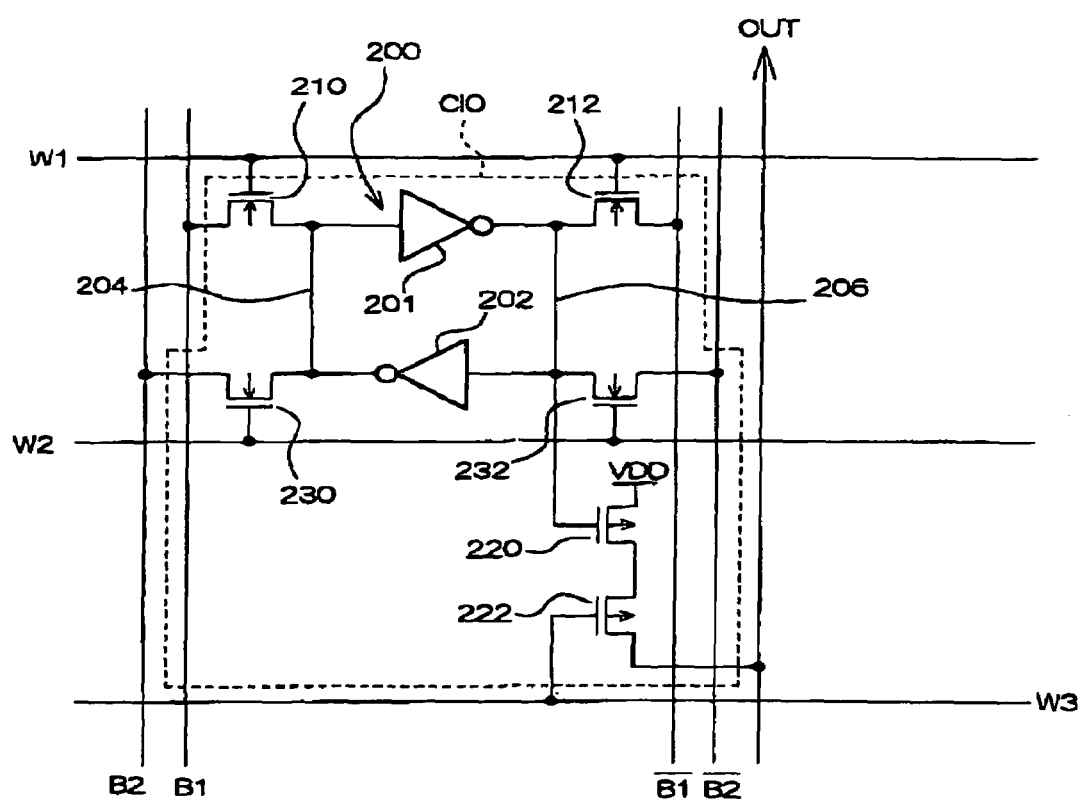
FIG. 6 is a circuit diagram of memory cells within the display data RAM of FIG. 5.

FIG. 6 shows an exemplary circuit diagram of the memory cell C10 within the display data RAM 160. The memory cell C10 has the same configuration as the other memory cells. This memory cell C10 has a memory element 200 formed of two CMOS inverters 201 and 202. The two MOS inverters 201 and 202 have first and second wires 204 and 206 that connect together the input and output sides thereof, respectively. A first n-type MOS transistor 210 (first switch) is connected between the first wire 204 and the bit line B1, with the gate thereof being connected to the first word line W1. Similarly a second n-type MOS transistor 212 (first switch) is connected between the second wire 206 and the bit line B1, with the gate thereof being connected to the first word line W1.

The above described configuration ensures that the first and second n-type transistors 210 and 212 are turned on when the first word line W1 goes high in answer to an active signal from the first page address decoder 152A. This connects the memory cell C10 to the first pair of bit lines B1 and /B1. If the first column switch SW1 is turned on by an active signal from the first column address decoder 142A during this time, it becomes possible to read or write data with respect to the memory cell C10.

The first and second p-type MOS transistors 220 and 222 are connected between a power line VDD and the display data output line OUT. The gate of the first p-type MOS transistor 220 is connected to the second wire 206 and the gate of the second p-type MOS transistor 222 is connected to the third word line W3.

Before data is read out of the memory cell C10 to the display data output line OUT, the display data output line OUT is pre-charged to low. In a state in which the third word line W3 is low and the second p-type MOS transistor 222 is on, after this pre-charge operation, the data on the display data output line OUT is latched into the PWM decoder circuit 180. During this time, if the potential of the second wire 206 is high (the potential of the first wire 204 is low), the display data output line OUT remains low, but if the potential of the second wire 206 is low (the potential of the first wire 204 is high), the display data output line OUT goes high. This makes it possible to read one line of display data from the display data RAM 160 simultaneously.

A further feature of this embodiment of the present invention lies in the way the second word line W2 and the second bit line pair B2 and /B2 are connected. To ensure that connection, a third n-type MOS transistor 230 (second switch) is connected between the first wire 204 and the bit line B2, with the gate thereof being connected to the second word line W2. Similarly, a fourth n-type MOS transistor 232 (second switch) is connected between the second wire 206 and the bit line /B2, with the gate thereof being connected to the second word line W2.

The above described configuration ensures that the third and fourth n-type transistors 230 and 232 turn on so that the memory cell C10 is connected to the second pair of bit lines B2 and /B2, if the second word line W2 goes high in answer to an active signal from the second page address decoder 154A. If the second column switch SW2 is turned on by an active signal from the second column address decoder 144A during this time, it becomes possible to write moving-image data with respect to the memory cell C10.

The MPU 10 has previously obtained the page and column addresses of the display data RAM 160 corresponding to the start and end addresses SA and EA of the moving-image display area 22A shown in FIG. 1 or 3, from moving-image information. For that reason, it is possible for the MPU 10 to repeatedly specify column and page addresses for an area corresponding to the moving-image display area 22A, from areas within the display data RAM 160, in accordance with a predetermined write frequency. The column and page addresses of this area corresponding to the moving-image display area 22A are input to the second column address control circuit 144 and the second page address control circuit 154 through the input-output buffer 102 and the MPU-related control circuit 130 of the X-driver IC 24. The column and page addresses of the display data RAM 160 are ultimately specified through the second column address decoder 144A and the second page address decoder 154A of FIG. 5. By transferring moving-image data through the input buffer 104 and the second bus line 120, the transfer can be done in real-time over a path that differs from that of the still-image data over the first bus line 110, so that the moving-image data can be rewritten in real-time.

The MPU 10 specifies the column address and page address of an area within the display data RAM 160 corresponding to the still-image display area 22B, so that data rewrite is performed at a predetermined write frequency only when there are changes in the still-image data, such as when information is input from the operation input section 38.

In this manner, this configuration of this embodiment implements address specification and data transfer by separate routes for still images and moving images written to the display data RAM 160, so that each set of data can be written to memory cells. It is therefore possible to write a still image and a moving image simultaneously to different memory cells in page units, so there is no necessity to halt the writing of either type of data.

Since the configuration is such that either a still image or a moving image can be written to memory cells, it is possible to modify the moving-image display area 22A as desired.

Figure 7:
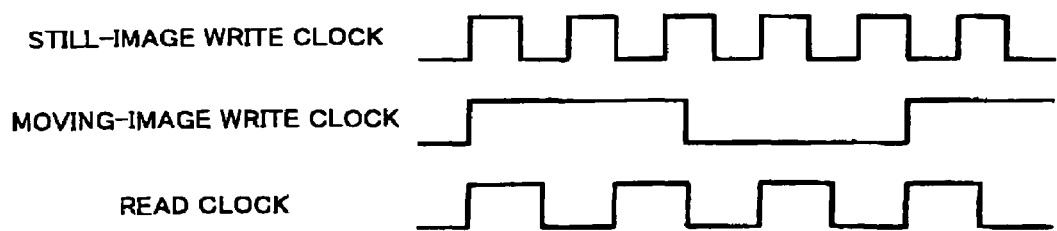
FIG. 7 is a waveform chart of a write clock for still and moving images and a display read clock.

When a moving image is to be displayed in the moving-image display area 22A of the liquid crystal panel 20 in this case, display data is read from the display data RAM 160 in accordance with a read clock shown in FIG. 7, to enable display at a rate of 60 Hz, in other words, 60 frames per second, by way of example.

For still-image data, on the other hand, display data is written to the display data RAM 160 in accordance with a still-image write clock that enables display at a frequency that is higher than that for driving the liquid crystal display, such as 90 Hz or 90 frames per second. Since this enables the implementation of rewriting of still images at a write rate that is faster than the display read rate, it becomes possible to provide a display that adapts to factors such as scroll display in accordance with the operation of the operation input section 38.

In contrast thereto, moving-image data makes use of the persistence-of-vision effect on human retinas, so there is no problem even when the number of frames in the moving image is low (it is not necessary to rewrite the entire 60 frames for the display), in cases where it is not required to have an accurate moving-image display, such as on a mobile telephone. With this embodiment of the present invention, writing can be done at a frequency that enables the writing of moving-image data at a rate such as 20 Hz, or 20 frames per second, so it suffices to send out ⅓ (20/60 for a frequency of 60 frames) of the data from the MPU 10 to the X-driver IC 24. If an X-driver IC without internal RAM were to be used, it would always be necessary to rewrite data for 60 frames, but such a lowering of the write frequency of moving images (lowering of the write rate), or the quantity of data to be rewritten, reduces the number of times that moving-image data is written, where that would usually necessitate rewriting of the contents of the display data RAM 160 (unlike with still images), and thus the power consumed can be reduced by an amount equivalent to that number of memory cells.

Figure 8:
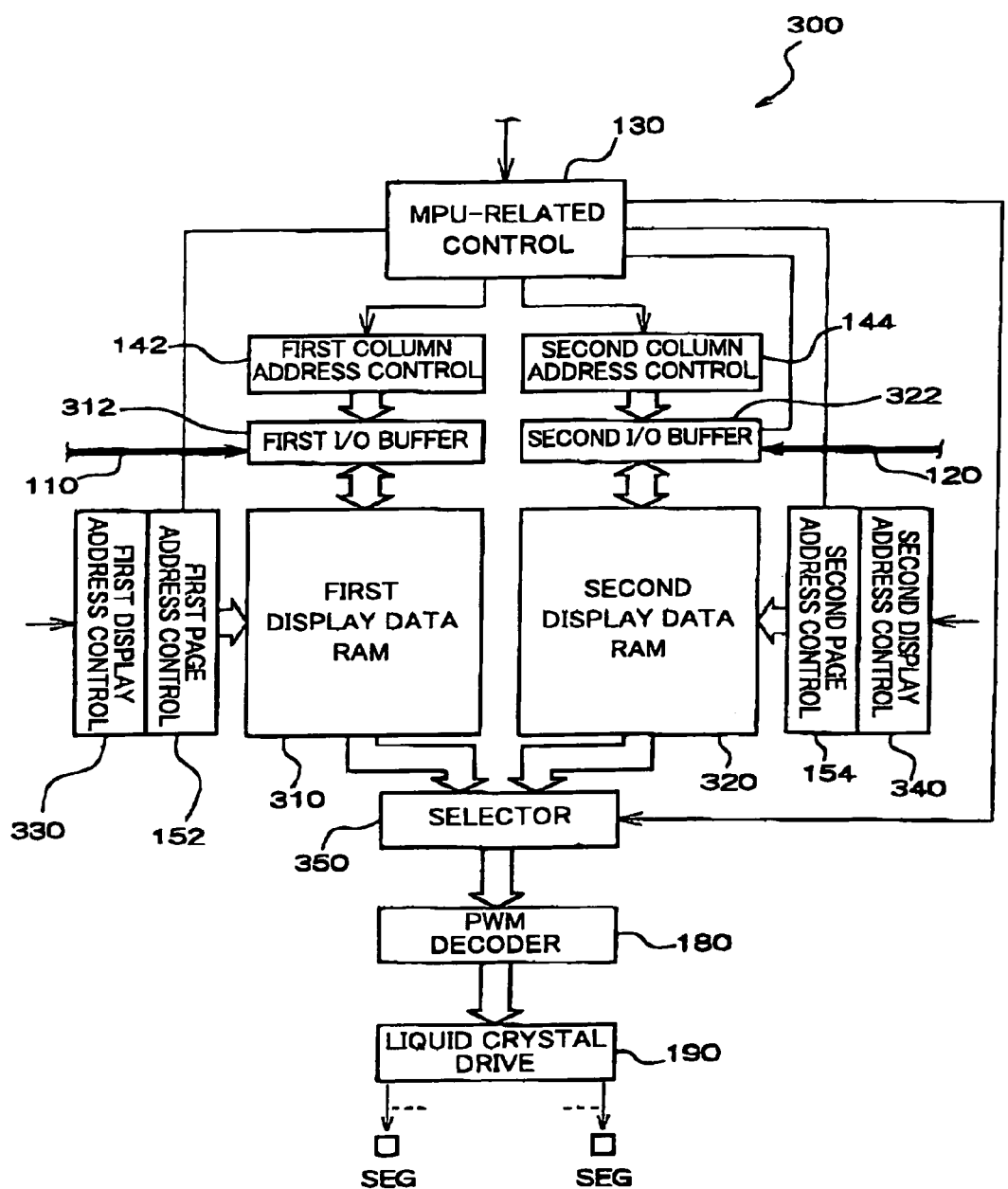
FIG. 8 is a schematic block diagram of an X-driver IC in accordance with the second embodiment of the present invention.

FIG. 8 shows an exemplary block diagram of part of an X-driver IC 300 in accordance with a second embodiment of the present invention Note that circuits in FIG. 8 that have the same functions as circuits in FIG. 4 are denoted by the same reference numbers and further description thereof is omitted. The circuits omitted from FIG. 8 are the same as those of FIG. 4.

The first way in which the X-driver IC 300 of FIG. 8 differs from the X-driver IC 24 of FIG. 4 is the provision of first and second display data RAMs 310 and 320. Still-image data is stored in the first RAM 310 and moving-image data is stored in the second RAM 320. Note that the first and second RAM portions 310 and 320 do not need the second word line W2, the second bit line pair B2 and /B2, the second column switch SW2, the second column address decoder 144A, and the second page address decoder 154A of FIG. 6, so memory cells of a prior-art configuration can be used therefore.

Figure 9:
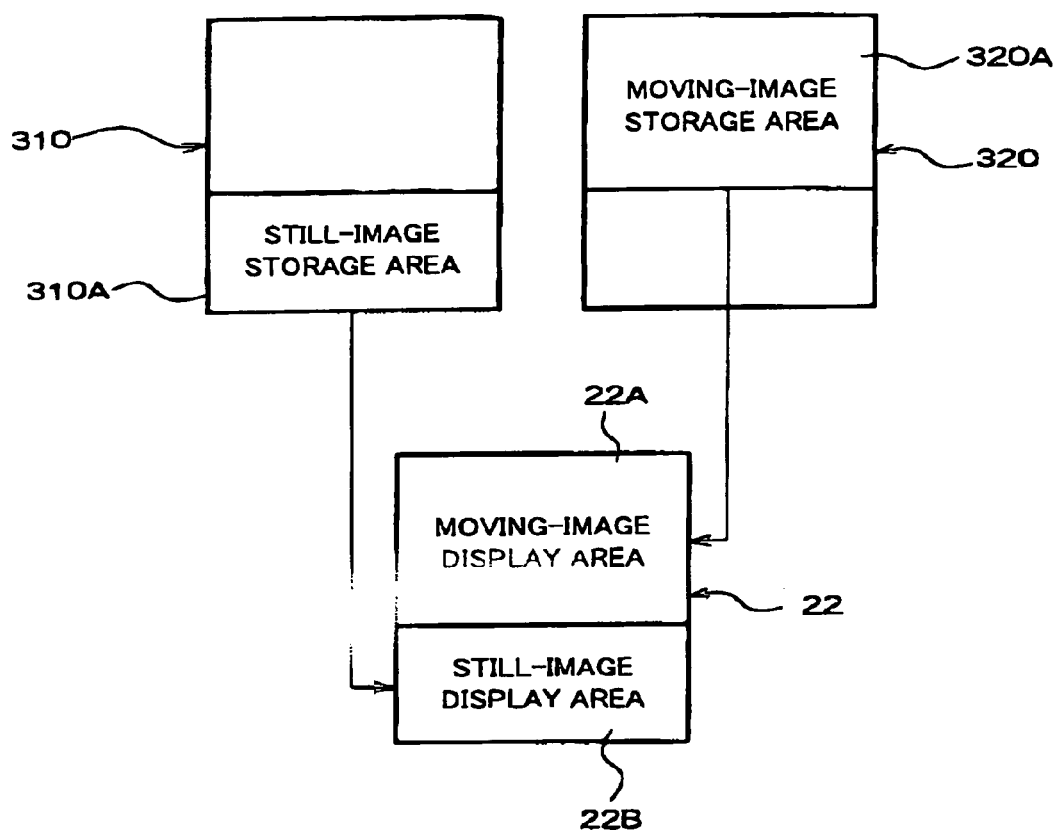
FIG. 9 is a schematic illustrative diagram of the relationship between storage areas of the first and second display data RAM of FIG. 8 and the display areas of the liquid crystal panel.

The relationships between a still-image storage area 310A of the first display data RAM 310, a moving-image storage area 320A of the second display data RAM 320, and the moving-image display area 22A and still-image display area 22B of the liquid crystal panel 22 are shown in FIG. 9.

The first and second display data RAMs 310 and 320 have storage areas corresponding to all the pixels of one screen of the liquid crystal panel 22. Accordingly, this makes it possible to vary the still-image storage area 310A and the moving-image storage area 320A of FIG. 13 as desired. Note that the memory spaces of the first and second display data RAMs 310 and 320 and the display space of the liquid crystal panel 22 are drawn to be the same size in FIG. 13, to facilitate description.

Data is written to the moving-image storage area 320A of the second display data RAM 320 at a frame rate of 20 frames per second, by way of example, and data is read therefrom at a frame rate of 60 frames per second and is displayed on the moving-image display area 22A of the liquid crystal panel 22. Conversely, data is written to the still-image storage area 310A of the first display data RAM 310 at a frame rate of 90 frames per second, by way of example, and is data is read therefrom at a frame rate of 60 frames per second and is displayed on the still-image display area 22B of the liquid crystal panel 22.

Thus the second embodiment differs from the first embodiment in the provision of the first and second display data RAMs 310 and 320. For that reason, the first column address control circuit 142, a first I/O buffer 312, the first page address control circuit 152, and a first display address control circuit 330 are provided to correspond to the first display data RAM 310. Similarly, the second column address control circuit 144, a second I/O buffer 322, the second page address control circuit 154, and a second display address control circuit 340 are provided to correspond to the second display data RAM 320.

A selector 350 is also provided to select display data from the first and second display data RAMs 310 and 320 on the basis of an output from the MPU-related control circuit 130, for output to the PWM decoder circuit 180.

Also in this second embodiment of the present invention, still images and moving images are transferred by separate systems over the first and second bus lines 110 and 120. In addition, column and page addresses for writing data to the first and second RAMs 310 and 320 are also specified by different systems for still images and moving images. For that reason, it is not necessary to wait for the writing of moving-image data to finish before writing still-image data, when still-image data is being rewritten into the first RAM 310 simultaneously with the rewriting of moving-image data into the second RAM 320.

In the RAM-incorporated X-driver ICs in accordance with the first and second embodiments, moving-image data and still-image data supplied from the MPU 10 are received over different transfer lines and writing is also done by separate systems, unlike in the prior art. However, if the amount of moving-image data to be transferred increases, because of an enlargement of the moving-image display area or an increase in the number of gray scales thereof, a limit is placed on the transfer capacity. From consideration of enlargement of the wiring area and the number of terminals for transferring a total of 21 terminals for the 6-bit R, G, and B signals, the clock signal CLK, and the horizontal/vertical synchronization signal H.Vsync, it becomes difficult to cope with a further increase in the number of gray scales and, in some circumstances, it is even possible that such an increase will cause deterioration in reliability.

In such a case, a RAM-incorporated driver IC 420 in accordance with the third embodiment of the present invention makes it possible to suppress any enlargement of the wiring area and number of terminals for the signals to be transferred, by supplying moving-image data from the MPU over a high-speed serial transfer line, and also enables writing of still-image data and moving-image data by separate systems.

In this case, a high-speed serial transfer line is a transfer line that enables high-speed transfer of data in serial form as a differential signal, where differential amplification is performed on the reception side. Various standards have been proposed for such a high-speed serial transfer line, such as the TIA-644 or EIA-644 of the Telecommunications Industry Association or the Electronic Industries Association, the IEEE 1596.3 of the Institute of Electrical and Electronics Engineers, the low voltage differential signaling (LVDS) standard, the IEEE 1394, or the universal serial bus (USB) standard.

Figure 10:
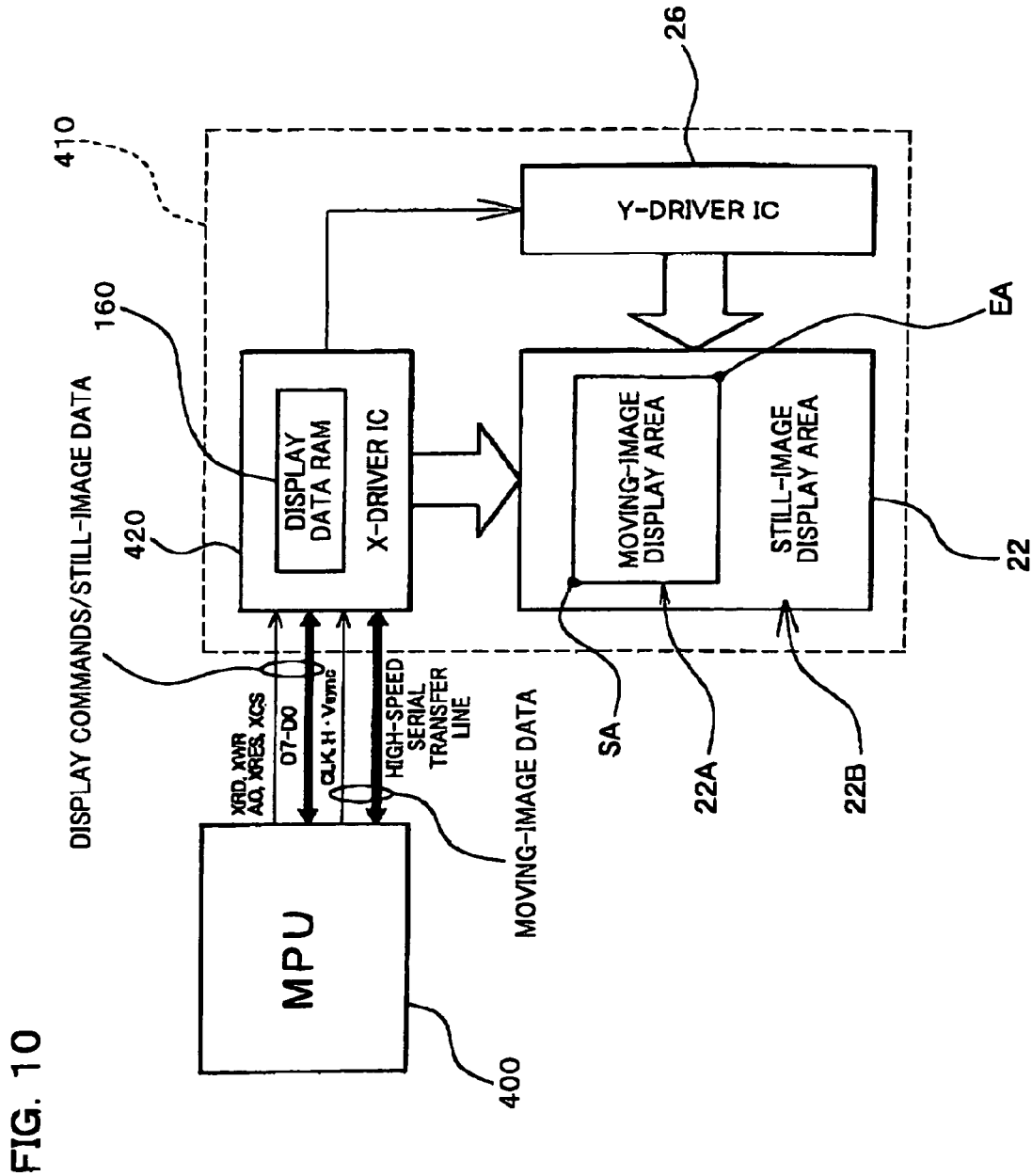
FIG. 10 is a schematic block diagram of electronic equipment provided with an X-driver IC in accordance with a third embodiment of the present invention.

FIG. 10 shows an exemplary schematic block diagram of electronic equipment provided with an X-driver IC 420 in accordance with the third embodiment of the present invention.

Note that circuits in FIG. 10 that have the same functions as circuits in FIG. 1 are denoted by the same reference numbers and further description thereof is omitted.

The electronic equipment of FIG. 10 differs from the electronic equipment of FIG. 1 in that an LVDS-standard high-speed serial transfer line is connected between an MPU 400 and an X-driver IC 420 of a display unit 410. The configuration is such that serial moving-image data is transferred as a differential signal over this high-speed serial transfer line.

The interface section of the display data transfer line is shown schematically in FIG. 11A and the interface section of the LVDS-standard high-speed serial transfer line is shown schematically in FIG. 11B.

In other words, with the technique shown in FIG. 11A a voltage is driven in accordance with the transfer data on a signal transfer line to which is added the wiring capacitance, by output buffers 450 and 452 that are configured of CMOS transistors. On the reception side, the signal transfer line is received by input buffers 454 and 456 configured of CMOS transistors. If the wiring capacitance of the data transfer line and the transfer line of the clock signal CLK in this case is assumed to be C [F], the data transfer rate is assumed to be f [Hz], and the power voltage of each output buffer is assumed to be V [V], the current consumption $I_{op0}$ accompanying the data transfer is given by the following Equation (1):

$$I_{op0} = fCV \text{ [A]} \tag{1}$$

This shows that the current consumption increases as the transfer rate rises. However, in practice it is not possible to increase the speed of data transfer much, because of the wiring capacitance C.

In contrast thereto, a differential signal corresponding to the transfer signal is output by the differential output drivers 460 and 462 from the transmission side, and the differentially input differential signal is subjected to differential amplification by receivers 464 and 466 on the reception side, as shown in FIG. 11B. More specifically, a steady current flows from the differential output driver on the transmission side with respect to a signal transfer line that is a balanced transfer line formed of a component such as a twisted-pair cable or a printed circuit board, and a differential voltage generated between terminal resistors R connected between the differentially operating signal transfer line is amplified by the differential input receivers on the reception side.

During this time, a PLL circuit 468 on the transmission side converts the data to be transferred into serial data, in synchronization with a step-down clock signal that is ⅛ of the clock signal CLK, by way of example, for transfer in synchronization with the clock signal CLK. On the reception side the received clock signal CLK is synchronized by another PLL circuit 470 with a step-down clock signal that is ⅛ of the clock signal CLK, by way of example, and the received serial data is converted into parallel data.

If it is assumed in this case that the steady current accompanying the transfer of the differential signal is $I_{const}$ [A] and the current consumed by the PLL circuits 468 and 470 on the transmission side and the reception side is $I_{pll}$ [A], the current consumption accompanying the data transfer is given by the following Equation (2):

$$I_{op1} = I_{const} + I_{pll} [A] \qquad (2)$$

Figure 12:
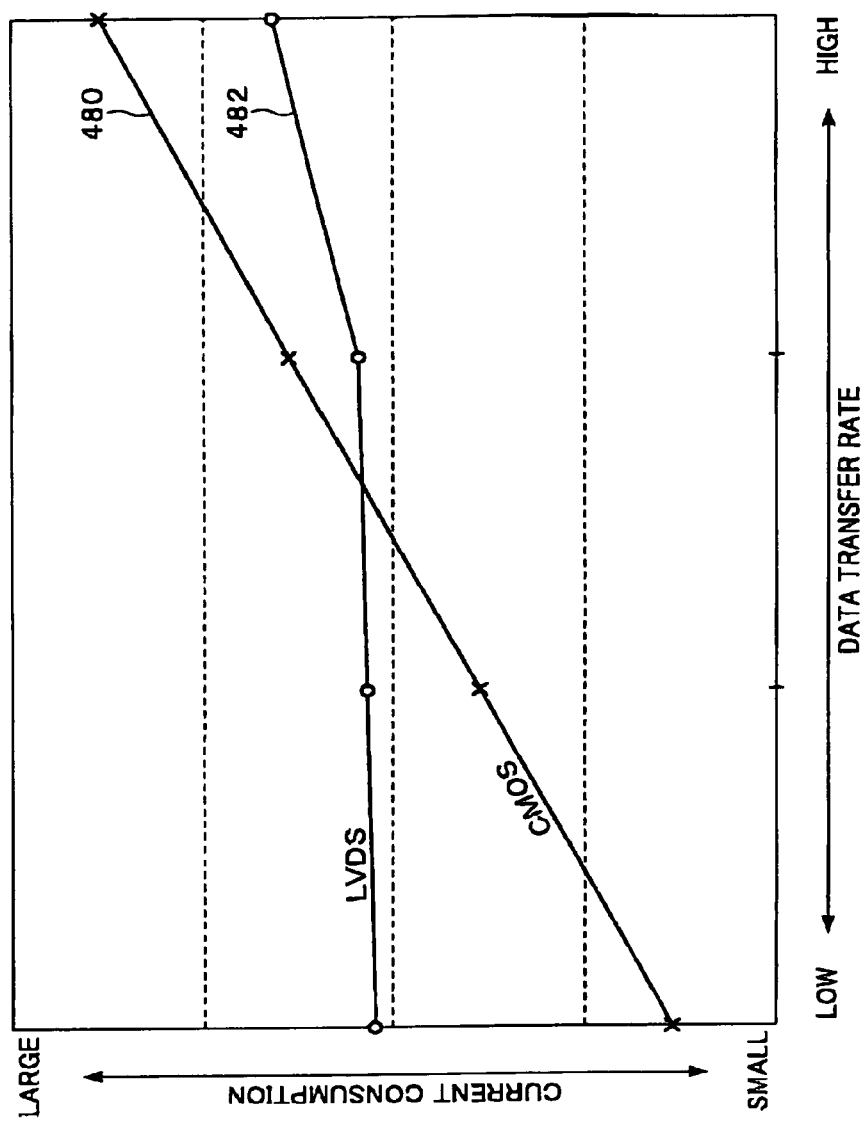
FIG. 12 is illustrative of the relationship between the current consumption accompanying data transfer in accordance with the LVDS standard and the current consumption accompanying data transfer by CMOS drivers.

The graph in FIG. 12 shows the relationship between current consumption accompanying data transfer in accordance with the LVDS standard and current consumption accompanying data transfer by CMOS drivers.

This graph shows a current consumption 480 that occurs during data transfer by drivers configured of CMOS transistors and a current consumption 482 that occurs during data transfer in accordance with the LVDS standard. In other words, when data transfer is done by the CMOS drivers of FIG. 11A, current consumption increases in proportion to the data transfer rate, as predicted by Equation (1). In contrast thereto, data transfer in accordance with the LVDS standard shown in FIG. 11B necessitates a steady current corresponding to the data transfer rate. The necessary steady current, however, has substantially the same value both when the data transfer rate is low and when it is high.

This therefore means that data transfer in accordance with the LVDS standard has a current consumption that is higher than that in the prior art when the transfer rate is low. However, this also means that when the transfer rate increases, it is possible to enable data transfer with a lower current consumption and a higher speed than in the prior art.

This third embodiment of the present invention is characterized in enabling both faster data transfer and reduced energy consumption, in comparison with prior-art data transfer, by suppressing the steady current consumption during the time periods during which no data transfer is occurring, when the data transfer rate is low. More specifically, the operation of the differential output drivers on the transmission side and the differential input receivers on the reception side is halted to remove the steady current.

Figure 13:
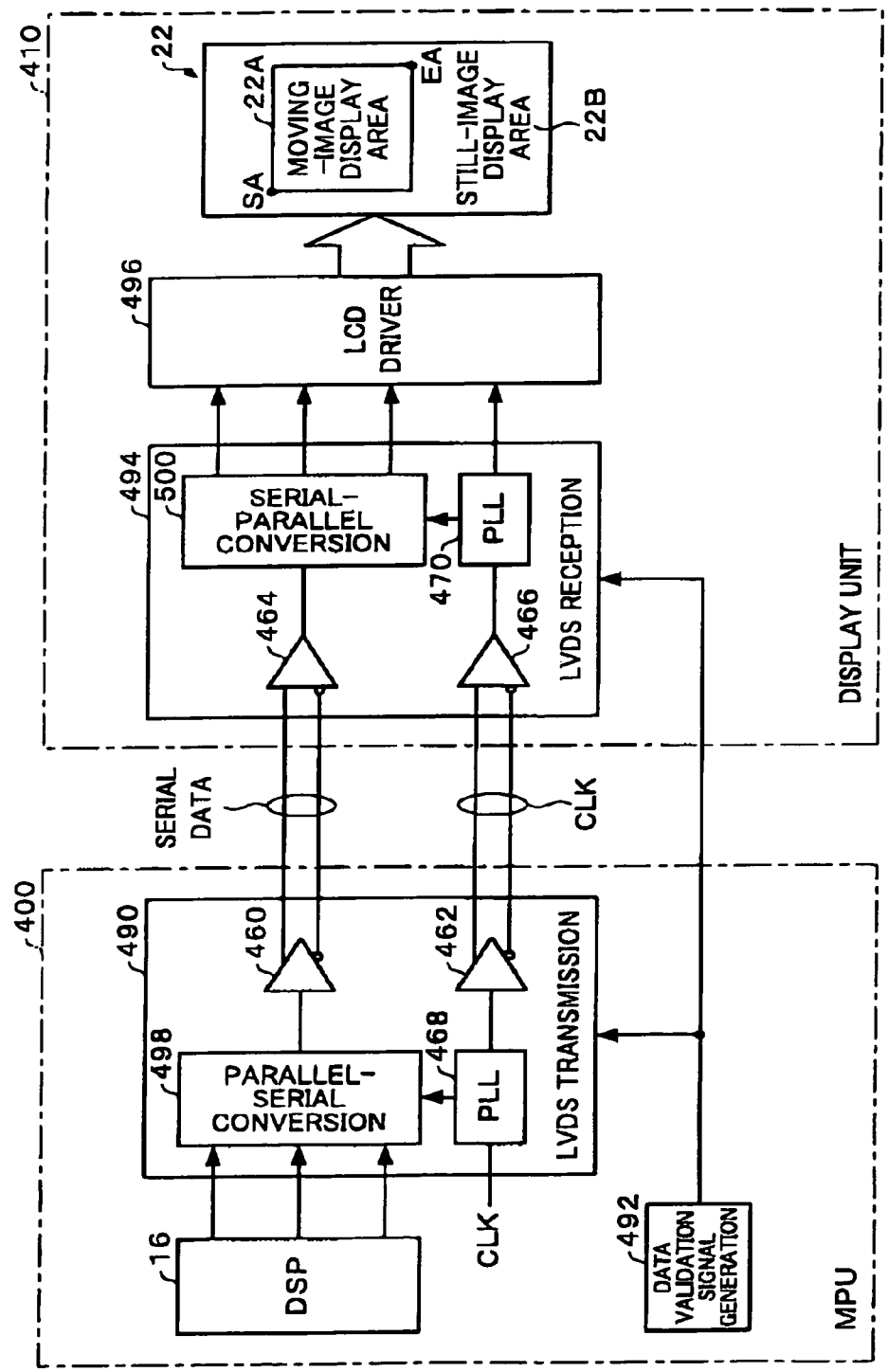
FIG. 13 is a schematic block diagram of essential structural components of the MPU, display unit, and interface section for performing high-speed serial transfer in accordance with the LVDS standard in the electronic equipment of the third embodiment.

Structural components of the MPU, display unit, and interface portions for high-speed serial transfer in accordance with the LVDS standard in electronic equipment of this third embodiment of the invention are shown in FIG. 13. Note that portions that are the same as those in FIGS. 1, 10, 11A, or 11B are denoted by the same reference numbers and further description thereof is omitted.

In this electronic equipment, the MPU 400 and the display unit 410 are connected by an LVDS-standard high-speed serial transfer line. The MPU 400 differs from the previously described MPU 10 in that it is provided with an LVDS transmission circuit 490, which has a transmission interface function for high-speed serial transfer in accordance with the LVDS standard, and a data validation signal generation circuit 492.

The display unit 410 differs from the previously described display unit 20 in that it is provided with a LVDS reception circuit 494 which has a reception interface function for high-speed serial transfer in accordance with the LVDS standard. In this case, an LCD driver 496 of the display unit 410 is equivalent to the X-driver IC 420 and Y-driver IC 26 of FIG. 10.

The LVDS transmission circuit 490 comprises at least differential output drivers 460 and 462, the PLL circuit 468, and a parallel-serial conversion circuit 498. The parallel-serial conversion circuit 498 Converts R, G, and B signals supplied by the DSP 16, which has a scan/converter function for moving-image data to be transferred, into serial data in synchronization with the step-down clock signal that has been stepped down by the PLL circuit 468, and supplies them to the differential output driver 460.

The data validation signal generation circuit 492 generates a data validation signal that goes active only when the moving-image data generated by the DSP 16 is valid, and outputs it to the LVDS reception circuit 494 of the display unit 410. The LVDS reception circuit 494 comprises at least the differential input receivers 464 and 466, the PLL circuit 470, and a serial-parallel conversion circuit 500.

The serial-parallel conversion circuit 500 converts the serial data received by the differential input receiver 464 into parallel data in synchronization with the step-down clock signal that is stepped down by the PLL circuit 470, and supplies it as R, G, and B signals to the LCD driver 496 (the X-driver IC 420). The configuration is such that the operation of at least the differential input receivers 464 and 466 and the PLL circuit 470 is halted when the data validation signal generated by the data validation signal generation circuit 492 is inactive, so that the steady current flowing therethrough is stopped.

The LVDS reception circuit 494 writes the R, G, and B signals to the data RAM of the X-driver IC in synchronization with the data validation signal generated by the data validation signal generation circuit 492. One screen of moving-image data is written to the data RAM in synchronization with the data validation signal that is output at the timing shown in FIG. 14, by way of example, and moving-image data for each line of one screen is written to data RAM in synchronization with the data validation signal that is output at the timing shown in FIG. 15. This ensures that the moving-image data can be displayed without errors, without providing a signal transfer line for the horizontal/vertical synchronization signal H.Vsync.

The thus configured data validation signal generation circuit 492 concentrates on the high-speed characteristics of the serial transfer line, so that both objectives of high-speed transfer and reduced energy consumption can be achieved by ensuring that the steady current necessary for serial transfer flows only when necessary.

Figure 14:
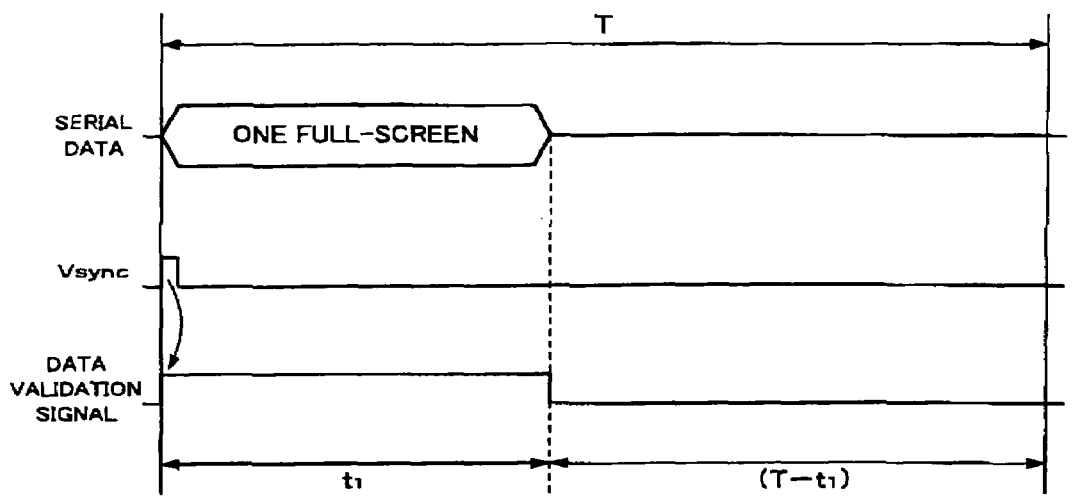
FIG. 14 is a timing chart of an example of the timing at which the data validation signal is generated by the data validation signal generation circuit.

An example of the timing at which the data validation signal is generated by the data validation signal generation circuit 492 is shown in FIG. 14. This figure illustrates a case in which one full-screen of moving-image data is transferred from the MPU 400 during 1 frame period T of the screen display. In other words, if one full-screen of moving-image data is transferred in a time that is shorter than one frame period T, the data validation signal generation circuit 492 makes the data validation signal active in synchronization with the vertical synchronization signal Vsync. Pulses are generated in such a manner as to create an active time period only for the amount of moving-image data for one screen, as was determined beforehand.

This configuration makes it possible to suppress the consumption of the steady current by the time period $(T-t_1)$, so that the steady current accompanying high-speed serial transfer is consumed only during the time period $t_1$.

The timing at which the data validation signal is generated by the data validation signal generation circuit 492 is not limited to the above case, and thus it can be generated at various other timings.

Figure 15:
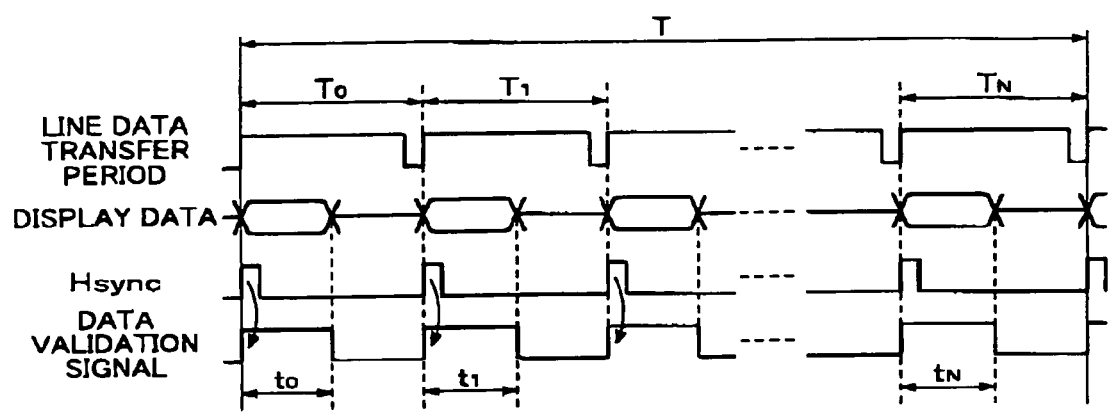
FIG. 15 is a timing chart of another example of the timing at which the data validation signal is generated by the data validation signal generation circuit.

Another example of the timing at which the data validation signal is generated by the data validation signal generation circuit 492 is shown in FIG. 15. This figure illustrates a case in which one full-screen of moving-image data is transferred from the MPU 400 one line at a time, during 1 frame period T of the screen display.

In other words, if moving-image data for one line of one screen is transferred at each time unit, which is equivalent to the frame period T divided by the number of lines in one screen, the data validation signal generation circuit 492 first makes the data validation signal go active for the first line of the screen in synchronization with the horizontal synchronization signal Hsync. Pulses are generated in such a manner as to create an active time period only for the amount of moving-image data for one line of one screen, as was determined beforehand. The data validation signal for the second line onward is similarly synchronized to the rise of the horizontal synchronization signal Hsync that is generated for each line, to generate pulses for the active time period for just the amount of moving-image data for each line of the previously determined full-screen.

It is also possible to generate a pulse-form data validation signal that goes active only for the amount of data for one line, for each previously determined line, in synchronization with the rise of the vertical synchronization signal Vsync.

This configuration makes it possible to ensure that the steady current is consumed with high-speed serial transfer only during time periods $t_0, t_1, \ldots, t_N$, during allocated line transfer time period $T_0, T_1, \ldots, T_N$ when the original one frame period has been divided into transfers of moving-image data for each line. This therefore makes it possible to suppress the consumption of the steady current during the time periods $(T_0-t_0), (T_1-t_1), \ldots, (T_N-t_N)$ within each transfer time period.

Figure 16:
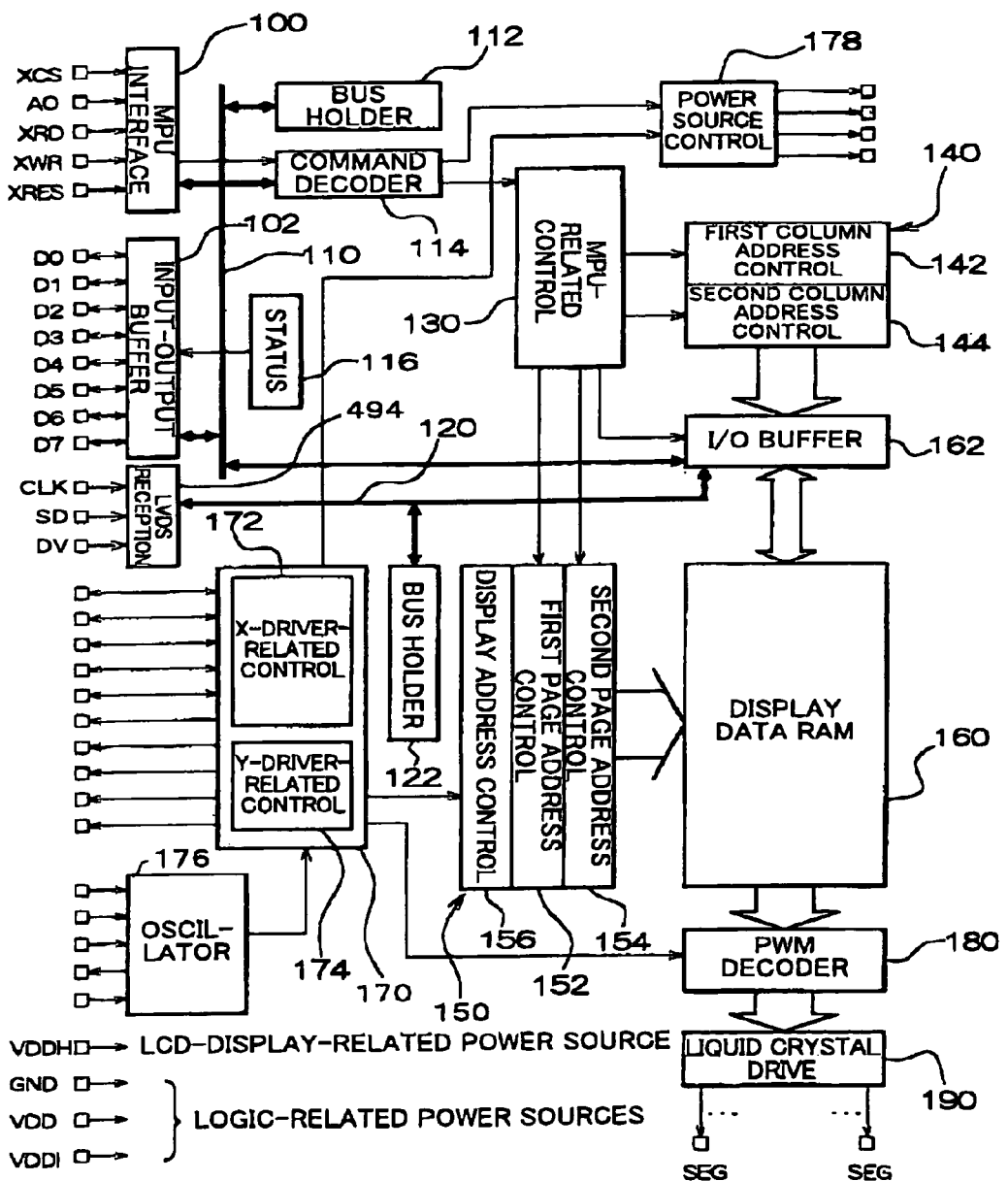
FIG. 16 is a schematic block diagram of the X-driver IC in accordance with the third embodiment of the present invention.

A block diagram shown in FIG. 16 is of the RAM-incorporated X-driver IC 420 of FIG. 10. This differs from the RAM-incorporated X-driver IC 24 in that it is provided with the LVDS reception circuit 494 instead of the input buffer 104.

The LVDS reception circuit 494 uses the differential input receiver to differentially amplify the clock signal CLK serial data SD that is input over the high-speed serial transfer line in accordance with the LVDS standard, as described with reference to FIG. 13, and converts it into parallel moving-image data. It also comprises an operation-halt control circuit which inputs a separate data validation signal DV and operates the differential input receivers of the clock signal CLK and the serial data only when the data validation signal DV is active. The thus configured LVDS reception circuit 494 is connected to the second bus line 120.

Figure 17:
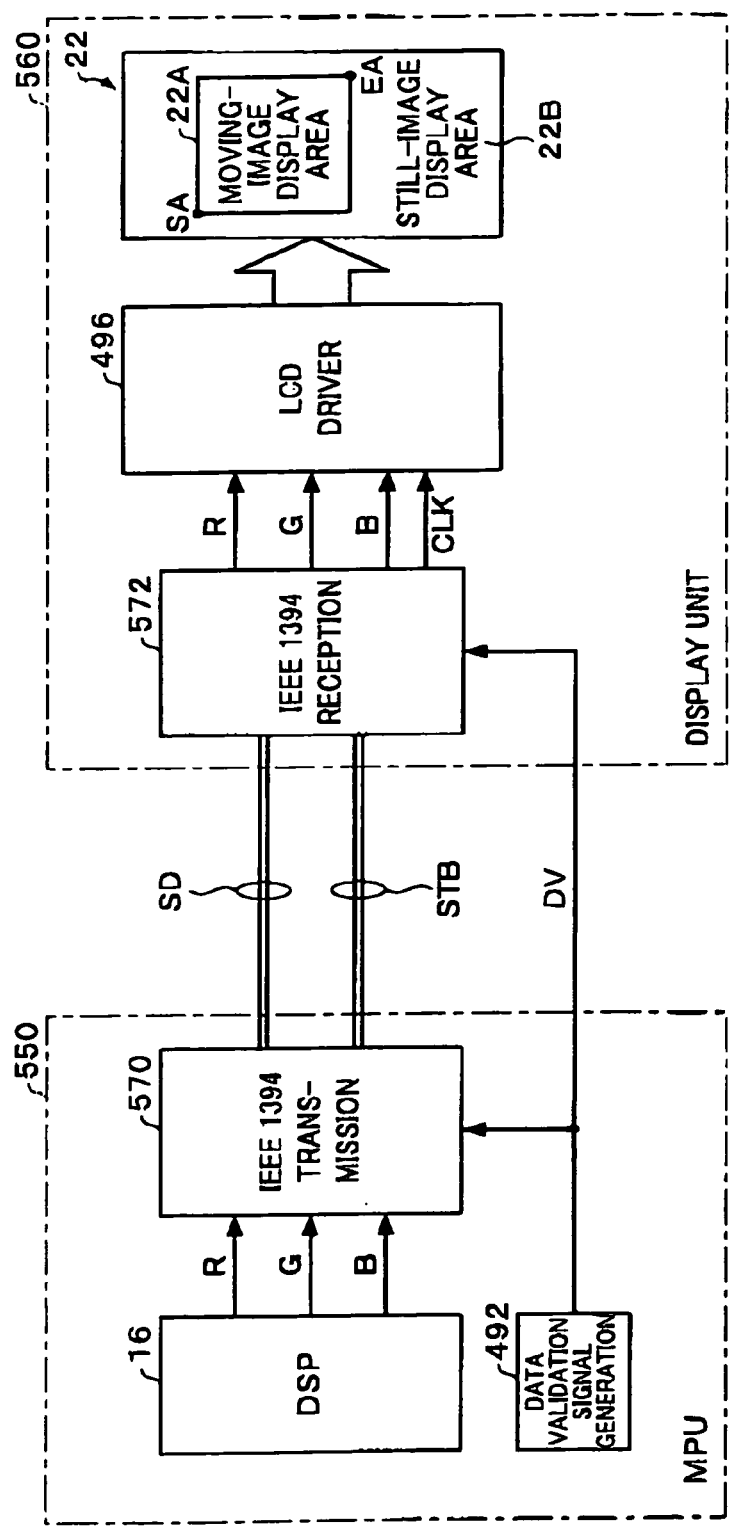
FIG. 17 is a schematic block diagram of essential structural components of the MPU, display unit, and interface section for performing high-speed serial transfer in accordance with the IEEE 1394 standard in the electronic equipment of the third embodiment.

Structural components of the MPU, display unit, and interface portions for high-speed serial transfer in accordance with the IEEE 1394 standard in electronic equipment of this third embodiment of the invention are shown in FIG. 17. Note that portions that are the same as those in FIGS. 1, 10, 11A, 11B, or 13 are denoted by the same reference numbers and further description thereof is omitted.

In this electronic equipment, an MPU 550 and a display unit 560 are connected by an IEEE-1394-standard high-speed serial transfer line.

The MPU 550 differs from the previously described MPU 400 in that it is provided with an IEEE 1394 transmission circuit 570 which has a high-speed serial transfer transmission interface function in accordance with the IEEE 1394 standard.

The display unit 560 differs from the previously described display unit 410 in that it is provided with an IEEE 1394 reception circuit 572 that has a high-speed serial transfer reception interface function in accordance with the IEEE 1394 standard.

The IEEE 1394 transmission circuit 570 comprises at least a parallel-serial conversion circuit, an encoding circuit, and a differential output driver (not shown in the figure) for performing high-speed serial transfer in accordance with the IEEE 1394 standard.

The parallel-serial conversion circuit in the IEEE 1394 transmission circuit 570 converts R, G, and B signals supplied by the DSP 16, which has a scan/converter function for moving-image data to be transferred, into serial data. The encoding circuit generates the serial data SD and a strobe signal STB from the serial R, G, and B signals, using a method called data/strobe link (DS link).

With the DS link method, high-speed serial transfer is performed by two pairs of differential signal lines for the serial data SD and the strobe signal STB. The IEEE 1394 transmission circuit 570 generates the serial data SD and the strobe signal STB in synchronization with the transmission clock, and transfers them over corresponding differential signal wires.

The IEEE 1394 reception circuit 572 comprises at least a differential input receiver, a decoding circuit, and a serial-parallel conversion circuit (not shown in the figure) for receiving high-speed serial transfer signals in accordance with the IEEE 1394 standard.

The differential input receiver in the IEEE 1394 reception circuit 572 receives the differentially amplified serial data SD and strobe signal STR for each differential signal line pair. The decoding circuit generates the serial moving-image data from the serial data SD and the strobe signal STB, and also extracts the clock signal CLK. The serial-parallel conversion circuit converts the serially-converted moving-image data into parallel data and supplies it as R, G, and B signals to the LCD driver 496.

Figure 18:
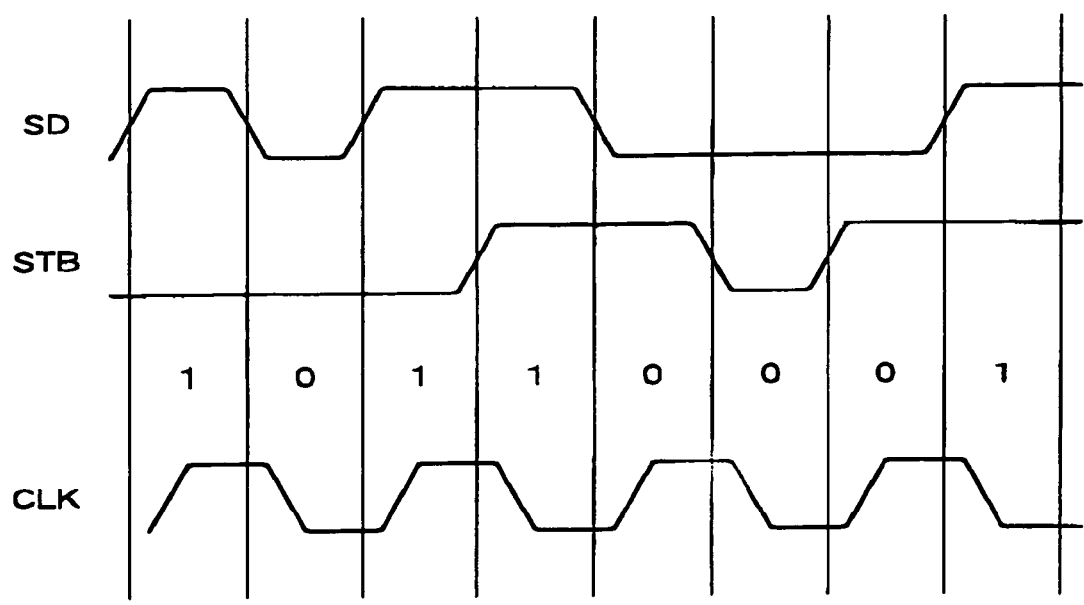
FIG. 18 is a timing chart of an example of transfer timing in accordance with the DS link method.

An example of the timing at which transfers are done between the MPU 550 and the display unit 560 of FIG. 17 by the DS link method is shown in FIG. 18. With the DS link method, the strobe signal STB is generated as shown in FIG. 18 with respect to the serial conversion of the serial data SD. In other words, the strobe signal STB changes if the same data continues in the serial data SD, but the strobe signal STB does not change if the serial data SD has changed.

In the IEEE 1394 reception circuit 572, the clock signal CLK is obtained from an OR of the serial data SD and the strobe signal STB. This clock signal CLK is supplied to the LCD driver 496 together with the R, G, and B signals that have been converted to parallel. The IEEE 1394 reception circuit 572 reduces energy consumption by causing the differential input receiver to operate only when the data validation signal DV generated by the data validation signal generation circuit 492 is active, in a similar manner to the LVDS reception circuit 494 of FIG. 13.

This use of the IEEE 1394 standard reduces energy consumption in a similar fashion to moving-image data transfer in accordance with the LVDS standard, by performing high-speed serial transfer of moving-image data between the MPU and the display unit, but it also makes PLL circuits unnecessary. It is therefore possible to make the circuit patterns smaller and remove the current consumption of the PLL circuits.

Figure 19:
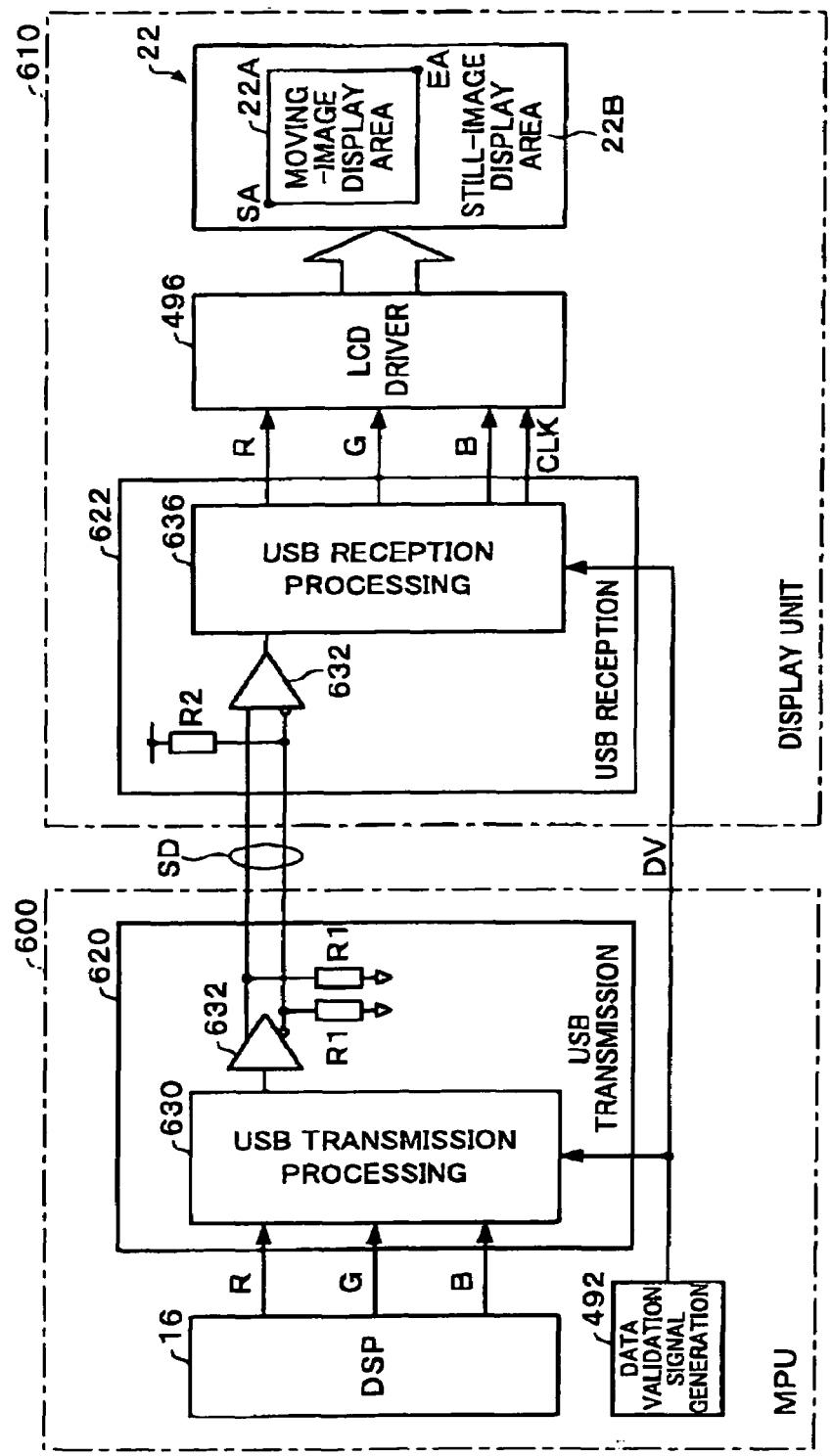
FIG. 19 is a schematic block diagram of essential structural components of the MPU, display unit, and interface section for performing high-speed serial transfer in accordance with the USB standard in the electronic equipment of the third embodiment.

Structural components of the MPU, display unit, and interface portions for high-speed serial transfer in accordance with the USB standard in electronic equipment of this third embodiment of the invention are shown in FIG. 19. In this case, portions within the USB-standard interface section that are the same as those in FIGS. 1, 10, 11A, 11B, or 13 are denoted by the same reference numbers and further description thereof is omitted.

In this electronic equipment, an MPU 600 and a display unit 610 are connected by a USB-standard high-speed serial transfer line. The MPU 600 differs from the previously described MPU 400 in that it is provided with a USB transmission circuit 620 which has a high-speed serial transfer transmission interface function in accordance with the USB standard.

The display unit 610 differs from the previously described display unit 410 in that it is provided with a USB reception circuit 622 that has a high-speed serial transfer reception interface function in accordance with the USB standard.

The USB transmission circuit 620 comprises at least a USB transmission processing circuit 630 and a differential output driver 632 for performing high-speed serial transfer in accordance with the USB standard. The positive and negative sides of the differential output driver 632 are each grounded by a pull-down resistor R1.

The USB transmission processing circuit 630 converts R, G, and B signals supplied by the DSP 16, which has a scan/converter function for moving-image data to be transferred, into serial data to form USB packets of a predetermined bit length.

The USB receive circuit 622 comprises at least a differential input receiver 634 and a USB reception processing circuit 636 for receiving high-speed serial transfers in accordance with the USB standard. The negative side of the differential input receiver 634 is pulled up by a pull-up resistor R2.

In addition to differential signals, high-speed serial transfers in accordance with the USB standard involves a division into packets units of a predetermined bit length, using a state called "single end 0" which occurs when the logic levels of both the positive side and the negative side of the differential signal line are low. This single end indicates the end of a packet.

The differential input receiver of the reception processing circuit is configured as a single-end receiver, in order to detect the low-level that is single end 0.

The USB reception processing circuit 636 analyzes the received packet data and turns the R, G, and B signals into parallel signals. Each packet of data starts from a 8-bit synchronization pattern, by way of example, where the reception processing circuit generates the clock signal CLK from this synchronization pattern and generates the R, G, and B signals in synchronization therewith.

This use of the USB standard reduces energy consumption in a similar fashion to moving-image data transfer in accordance with the LVDS standard, by performing high-speed serial transfer of moving-image data between the MPU and the display unit, but it also makes PLL circuits unnecessary. It is therefore possible to make the circuit patterns smaller and remove the current consumption of the PLL circuits.

It is to be understood that the present invention is not limited to the embodiments described above and thus various modifications and changes may be made without departing from the spirit and scope of the present invention.

Similarly, the configurations of the differential output drivers and differential input receivers for implementing high-speed serial transfer in the embodiments described above are not limited to various technologies such as CMOS or ECL.

It is particularly preferable to apply the present invention to data transfer by the LVDS standard, IEEE 1394 standard, or USB standard, but it is not limited thereto. For example, the present invention could also be applied to data transfer by any standard based on a concept similar to such high-speed serial data transfer, or on any standard derived therefrom.

What is claimed is:

1. A RAM-incorporated driver that drives a display section based on still-image data and moving-image data, the RAM-incorporated driver comprising:

a first port through which the still-image data or a given command is input from a microprocessor unit that is external to the RAM-incorporated driver;

a second port through which the moving-image data, which is transferred serially over a serial transfer line from the microprocessor unit that is external to the RAM-incorporated driver, is input as a differential signal;

a reception circuit which differentially amplifies the differential signal input from the second port and creates the moving-image data in a parallel state;

a RAM which stores the still-image data that was input through the first port and the moving-image data that was created by the reception circuit;

a first control circuit which controls writing or reading of the still-image data or the moving-image data that has been input separately through the first port or the second port, with respect to the RAM; and a second control circuit that, independently of the first control circuit, controls the reading of display data of the still-image data or moving-image data that has been stored in the RAM, and drives the display section to display, wherein the RAM includes memory cells each of which has two input ports through which the moving-image data and the still-image data are input separately and an output port through which data stored in the memory cell is output.

2. The RAM-incorporated driver as defined by claim 1, further comprising:

a halt control circuit which receives with the differential signal a data validation signal indicating whether or not the differential signal is valid, and halts at least part of an operation of the reception circuit, based on the data validation signal.

3. The RAM-incorporated driver as defined by claim 2, wherein the validation signal is used as a synchronization signal that synchronizes the writing of the moving-image data into the RAM.

4. The RAM-incorporated driver as defined by claim 2, wherein the validation signal is used as a synchronization signal that synchronizes the writing of the moving-image data for one line of the display section into the RAM.

5. The RAM-incorporated driver as defined by claim 2, wherein the validation signal is used as a synchronization signal that synchronizes the writing of the moving-image data for one full-screen of the display section into the RAM.

6. The RAM-incorporated driver as defined by claim 1, wherein the serial transfer line is a transfer line in accordance with an LVDS standard.

7. The RAM-incorporated driver as defined by claim 2, wherein the serial transfer line is a transfer line in accordance with an LVDS standard.

8. The RAM-incorporated driver as defined by claim 3, wherein the serial transfer line is a transfer line in accordance with an LVDS standard.

9. The RAM-incorporated driver as defined by claim 4, wherein the serial transfer line is a transfer line in accordance with an LVDS standard.

10. The RAM-incorporated driver as defined by claim 5, wherein the serial transfer line is a transfer line in accordance with an LVDS standard.

11. The RAM-incorporated driver as defined by claim 1, wherein the serial transfer line is a transfer line in accordance with a USB standard.

12. The RAM-incorporated driver as defined by claim 2, wherein the serial transfer line is a transfer line in accordance with a USB standard.

13. The RAM-incorporated driver as defined by claim 3, wherein the serial transfer line is a transfer line in accordance with a USB standard.

14. The RAM-incorporated driver as defined by claim 4, wherein the serial transfer line is a transfer line in accordance with a USB standard.

15. The RAM-incorporated driver as defined by claim 5, wherein the serial transfer line is a transfer line in accordance with a USB standard.

16. The RAM-incorporated driver as defined by claim 1, wherein the serial transfer line is a transfer line in accordance with an IEEE 1394 standard.

17. The RAM-incorporated driver as defined by claim 2, wherein the serial transfer line is a transfer line in accordance with an IEEE 1394 standard.

18. The RAM-incorporated driver as defined by claim 3, wherein the serial transfer line is a transfer line in accordance with an IEEE 1394 standard.

19. The RAM-incorporated driver as defined by claim 4, wherein the serial transfer line is a transfer line in accordance with an IEEE 1394 standard.

20. The RAM-incorporated driver as defined by claim 5, wherein the serial transfer line is a transfer line in accordance with an IEEE 1394 standard.

21. A display unit, comprising:
a panel having an electro-optical element driven by a plurality of first electrodes and a plurality of second electrodes;
the RAM-incorporated driver as defined by claim 1, which drives the plurality of first electrodes; and
a scanning driver that scans and drives the plurality of second electrodes.

22. A display unit, comprising:
a panel having an electro-optical element driven by a plurality of first electrodes and a plurality of second electrodes;
the RAM-incorporated driver as defined by claim 2, which drives the plurality of first electrodes; and
a scanning driver that scans and drives the plurality of second electrodes.

23. A display unit, comprising:
a panel having an electro-optical element driven by a plurality of first electrodes and a plurality of second;
the RAM-incorporated driver as defined by claim 3, which drives the plurality of first electrodes; and
a scanning driver that scans and drives the plurality of second electrodes.

24. A display unit, comprising:
a panel having an electro-optical element driven by a plurality of first electrodes and a plurality of second electrodes;
the RAM-incorporated driver as defined by claim 4, which drives the plurality of first electrodes; and
a scanning driver that scans and drives the plurality of second electrodes.

25. A display unit, comprising:
a panel having an electro-optical element driven by a plurality of first electrodes and a plurality of second electrodes;
the RAM-incorporated driver as defined by claim 5, which drives the plurality of first electrodes; and
a scanning driver that scans and drives the plurality of second electrodes.

26. Electronic equipment, comprising:
the display unit as defined by claim 21; and
the microprocessor unit which supplies the command, the still-image data, and the moving-image data to the display unit.

27. A RAM-incorporated driver that drives a display section based on still-image data and moving-image data, the RAM-incorporated driver comprising:
a first port through which the still-image data or a given command is input;
a second port, independent from the first port, through which the moving-image data which is transferred serially over a serial transfer line, is input as a differential signal;
a reception circuit which differentially amplifies the differential signal input from the second port and creates the moving-image data in a parallel state;
a RAM which stores the still-image data that was input through the first port and the moving-image data that was created by the reception circuit;
a first control circuit which controls writing or reading of the still-image data or the moving-image data that has been input separately through the first port or the second port, with respect to the RAM; and
a second control circuit that, independently of the first control circuit, controls the reading of display data of the still-image data or moving-image data that has been stored in the RAM, and drives the display section to display,
wherein the still-image data can be rewritten irrespective of the timing at which the moving-image data is rewritten in the RAM, wherein the RAM includes memory cells each of which has two input ports through which the moving-image data and the still-image data are input separately and an output port through which data stored in the memory cell is output.

28. A display unit, comprising:
- a panel having an electro-optical element driven by a plurality of first electrodes and a plurality of second electrodes;
- the RAM-incorporated driver as defined by claim 27, which drives the plurality of first electrodes; and
- a scanning driver that scans and drives the plurality of second electrodes.

29. Electronic equipment, comprising:
- the display unit as defined by claim 28; and
- a microprocessor unit which supplies the command, the still-image data, and the moving-image data to the display unit.

30. The RAM-incorporated driver as defined by claim 27, wherein the first port is not directly connected to the second port.

31. A RAM-incorporated driver that drives a display section based on still-image data and moving-image data, the RAM-incorporated driver comprising:
- a first port through which the still-image data or a given command is input;
- a second port, independent from the first port, through which the moving-image data which is transferred serially over a serial transfer line, is input as a differential signal;
- a reception circuit which differentially amplifies the differential signal input from the second port and creates the moving-image data in a parallel state;
- a RAM which stores the still-image data that was input through the first port and the moving-image data that was created by the reception circuit;
- a first control circuit which controls writing or reading of the still-image data and the moving-image data that has been input separately through the first port or the second port, with respect to the RAM; and
- a second control circuit that, independently of the first control circuit, controls the reading of display data of the still-image data or moving-image data that has been stored in the RAM, and drives the display section to display, wherein the RAM includes memory cells each of which has two input ports through which the moving-image data and the still-image data are input separately and an output port through which data stored in the memory cell is output.

32. A display unit, comprising:
- a panel having an electro-optical element driven by a plurality of first electrodes and a plurality of second electrodes;
- the RAM-incorporated driver as defined by claim 31, which drives the plurality of first electrodes; and
- a scanning driver that scans and drives the plurality of second electrodes.

33. Electronic equipment, comprising:
- the display unit as defined by claim 32; and
- a microprocessor unit which supplies the command, the still-image data, and the moving-image data to the display unit.

34. The RAM-incorporated driver as defined by claim 31, wherein the first port is not directly connected to the second port.

* * * * *